United States Patent
Chu et al.

(10) Patent No.: US 11,335,691 B2
(45) Date of Patent: May 17, 2022

(54) MEMORY STRUCTURE

(71) Applicant: Powerchip Semiconductor Manufacturing Corporation, Hsinchu (TW)

(72) Inventors: Ying-Tsung Chu, Hsinchu (TW); Ching-Kang Chiu, Hsinchu (TW); Ching-Sung Ho, Taichung (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/182,149

(22) Filed: Feb. 22, 2021

(65) Prior Publication Data

US 2021/0175237 A1  Jun. 10, 2021

Related U.S. Application Data

(62) Division of application No. 16/424,518, filed on May 29, 2019, now Pat. No. 10,971,501.

(30) Foreign Application Priority Data

Apr. 15, 2019  (TW) ................................. 108112991

(51) Int. Cl.
| | |
|---|---|
| *H01L 27/108* | (2006.01) |
| *H01L 21/223* | (2006.01) |
| *H01L 29/49* | (2006.01) |
| *H01L 29/66* | (2006.01) |
| *H01L 21/285* | (2006.01) |

(Continued)

(52) U.S. Cl.
CPC .... *H01L 27/10894* (2013.01); *H01L 21/2236* (2013.01); *H01L 21/28052* (2013.01); *H01L 21/28518* (2013.01); *H01L 27/10823* (2013.01); *H01L 27/10876* (2013.01); *H01L 27/10897* (2013.01); *H01L 29/45* (2013.01); *H01L 29/4933* (2013.01); *H01L 29/665* (2013.01)

(58) Field of Classification Search
None
See application file for complete search history.

(56) References Cited

U.S. PATENT DOCUMENTS 6,461,959 B1 * 10/2002 Chien ............... H01L 21/76889
                                                        257/E21.593
2004/0183111 A1 * 9/2004 Shinkawata ............ H01L 28/91
                                                        257/296

(Continued)

*Primary Examiner* — Steven M Christopher
(74) *Attorney, Agent, or Firm* — JCIPRNET

(57) ABSTRACT

A memory structure including a substrate, a memory cell, and a transistor is provided. The substrate includes a memory cell region and a peripheral circuit region. The memory cell is located in the memory cell region. The transistor is located in the peripheral circuit region. The transistor includes a gate, a first doped region, a second doped region, a first nickel silicide layer, and a second nickel silicide layer. The gate is located on the substrate and is insulated from the substrate. The first doped region and the second doped region are located in the substrate on two sides of the gate. The first nickel silicide layer is located on an entire top surface of the first doped region, and the second nickel silicide layer is located on an entire top surface of the second doped region.

6 Claims, 19 Drawing Sheets

(51) Int. Cl.
*H01L 21/28* (2006.01)
*H01L 29/45* (2006.01)

(56) References Cited

U.S. PATENT DOCUMENTS

| | | | |
|---|---|---|---|
| 2009/0159978 A1* | 6/2009 | Matsubara | H01L 29/66545 257/368 |
| 2011/0092060 A1* | 4/2011 | Lee | H01L 29/66621 438/586 |
| 2013/0043483 A1* | 2/2013 | Chan | H01L 21/8258 257/76 |
| 2014/0299889 A1* | 10/2014 | Cho | H01L 27/092 257/77 |
| 2015/0349121 A1* | 12/2015 | Dasaka | H01L 29/66659 257/303 |
| 2017/0317076 A1* | 11/2017 | Shen | H01L 21/76897 |
| 2018/0226409 A1* | 8/2018 | Wang | H01L 27/10805 |

* cited by examiner

MEMORY STRUCTURE

CROSS-REFERENCE TO RELATED APPLICATION

This application is a divisional application of and claims the priority benefit of U.S. application Ser. No. 16/424,518, filed on May 29, 2019, now allowed, which claims the priority benefit of Taiwan application serial no. 108112991, filed on Apr. 15, 2019. The entirety of the above-mentioned patent applications is hereby incorporated by reference herein and made a part of this specification.

BACKGROUND OF THE INVENTION

Field of the Invention

The invention relates to a semiconductor structure and a manufacturing method thereof, and particularly relates to a memory structure and a manufacturing method thereof.

Description of Related Art

Currently, the common data processing method is to perform data processing by using the memory and the processor located on different chips. However, when performing a large amount of data processing, it requires a lot of energy and time to move data back and forth between various memories and processors.

Therefore, a memory structure in which the memory and the processor are integrated on the same chip has been gradually developed. However, in order to effectively integrate the memory and the processor on the same chip, it is necessary to improve the performance of the transistor in the peripheral circuit region.

SUMMARY OF THE INVENTION

The invention provides a memory structure and a manufacturing method thereof, which can have a better electrical performance.

The invention provides a memory structure, which includes a substrate, a memory cell, and a transistor. The substrate includes a memory cell region and a peripheral circuit region. The memory cell is located in the memory cell region. The transistor is located in the peripheral circuit region. The transistor includes a gate, a first doped region, a second doped region, a first nickel silicide layer, and a second nickel silicide layer. The gate is located on the substrate and is insulated from the substrate. The first doped region and the second doped region are located in the substrate on two sides of the gate. The first nickel silicide layer is located on an entire top surface of the first doped region, and the second nickel silicide layer is located on an entire top surface of the second doped region.

According to an embodiment of the invention, in the memory structure, the gate of the transistor may include a doped polysilicon layer, a metal layer, a hard mask layer, and a gate dielectric layer. The metal layer is located on the doped polysilicon layer. The hard mask layer is located on the metal layer. The gate dielectric layer is located between the doped polysilicon layer and the substrate.

According to an embodiment of the invention, in the memory structure, the gate of the transistor may include a doped polysilicon layer, a third nickel silicide layer, and a gate dielectric layer. The third nickel silicide layer is located on the doped polysilicon layer. The gate dielectric layer is located between the doped polysilicon layer and the substrate.

According to an embodiment of the invention, in the memory structure, the third nickel silicide layer may be located on an entire top surface of the doped polysilicon layer, and the doped polysilicon layer may directly contact the third nickel silicide layer and the gate dielectric layer.

According to an embodiment of the invention, in the memory structure, the first nickel silicide layer and the second nickel silicide layer may contain aluminum.

According to an embodiment of the invention, in the memory structure, the first nickel silicide layer and the second nickel silicide layer are, for example, salicide (self-aligned silicide) layers.

The invention provides a method of manufacturing a memory structure, which includes the following steps. A substrate is provided. The substrate includes a memory cell region and a peripheral circuit region. A memory cell is formed in the memory cell region. A transistor is formed in the peripheral circuit region. The transistor includes a gate, a first doped region, a second doped region, a first nickel silicide layer, and a second nickel silicide layer. The gate is located on the substrate and is insulated from the substrate. The first doped region and the second doped region are located in the substrate on two sides of the gate. The first nickel silicide layer is located on the first doped region, and the second nickel silicide layer is located on the second doped region. A dielectric layer covering the first nickel silicide layer and the second nickel silicide layer is formed. A first opening exposing the first nickel silicide layer and a second opening exposing the second nickel silicide layer are formed in the dielectric layer. A first contact and a second contact are respectively formed in the first opening and the second opening.

According to an embodiment of the invention, in the method of manufacturing the memory structure, the method of forming the memory cell may include the following steps. A buried conductive structure is formed in the substrate. A third contact is formed on the substrate on one side of the buried conductive structure. A conductive line coupled to the third contact is formed. After the conductive line is formed, a fourth contact is formed on the substrate on another side of the buried conductive structure.

According to an embodiment of the invention, in the method of manufacturing the memory structure, the method of forming the transistor may include respectively forming the first nickel silicide layer and the second nickel silicide layer on the first doped region and the second doped region after forming the fourth contact.

According to an embodiment of the invention, in the method of manufacturing the memory structure, the method of forming the transistor may include respectively forming the first nickel silicide layer and the second nickel silicide layer on the first doped region and the second doped region after forming the conductive line and before forming the fourth contact.

According to an embodiment of the invention, the method of manufacturing the memory structure may further include forming a metal silicide layer on the fourth contact.

According to an embodiment of the invention, in the method of manufacturing the memory structure, the metal silicide layer may be simultaneously formed in the step of forming the first nickel silicide layer and the second nickel silicide layer.

According to an embodiment of the invention, in the method of manufacturing the memory structure, after the first nickel silicide layer and the second nickel silicide layer are formed, the metal silicide layer may be formed.

According to an embodiment of the invention, in the method of manufacturing the memory structure, the gate of the transistor includes a doped polysilicon layer and a metal layer. The doped polysilicon layer and the third contact of the memory cell region are, for example, formed by the same material layer. The metal layer and the conductive line of the memory cell region are, for example, formed by the same material layer.

According to an embodiment of the invention, in the method of manufacturing the memory structure, the method of forming the transistor may include simultaneously forming a third nickel silicide layer on the gate in the step of forming the first nickel silicide layer and the second nickel silicide layer.

According to an embodiment of the invention, in the method of manufacturing the memory structure, the method of forming the first nickel silicide layer and the second nickel silicide layer may include the following steps. A nickel layer is formed on the first doped region and the second doped region. A thermal process is performed to react the nickel layer with the substrate to form the first nickel silicide layer and the second nickel silicide layer.

According to an embodiment of the invention, in the method of manufacturing the memory structure, the method of forming the first nickel silicide layer and the second nickel silicide layer may further include forming an aluminum layer on the first doped region and the second doped region before forming the nickel layer.

According to an embodiment of the invention, in the method of manufacturing the memory structure, the target for forming the nickel layer is, for example, a NiPt target. The content of Pt in the NiPt target is, for example, greater than 5% and less than or equal to 50%.

According to an embodiment of the invention, the method of manufacturing the memory structure may further include forming a stress adjustment layer covering the gate after forming the first nickel silicide layer and the second nickel silicide layer and before forming the dielectric layer.

According to an embodiment of the invention, in the method of manufacturing the memory structure, the method of forming the first doped region and the second doped region is, for example, a plasma doping (PLAD) method.

Based on the above description, in the memory structure and the manufacturing method thereof according to the invention, since the first nickel silicide layer and the second nickel silicide layer are respectively located on the first doped region and the second doped region, the transistor in the peripheral circuit region can have lower resistance and larger saturation current. Thereby, the performance of the transistor can be effectively improved. Thus, the electrical performance of the memory structure can be improved.

In order to make the aforementioned and other objects, features and advantages of the invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
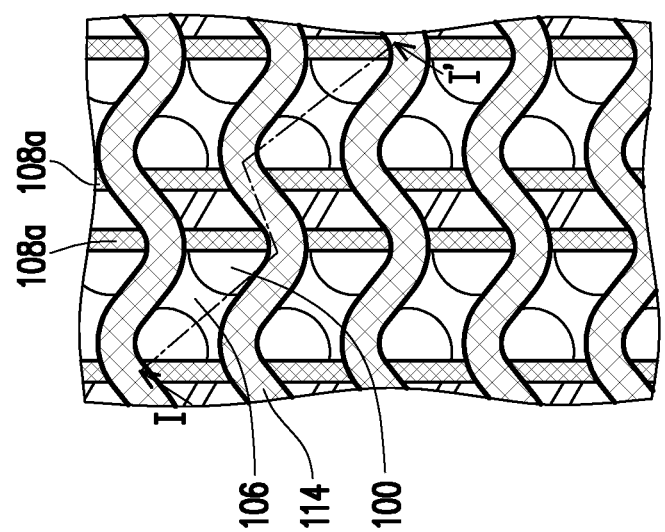
FIG. 1 is a top view illustrating some components in a memory cell region of a memory structure according to an embodiment of the invention.

FIG. 1 is a top view illustrating some components in a memory cell region of a memory structure according to an embodiment of the invention. FIG. 2A to FIG. 2H are cross-sectional views illustrating a manufacturing process of a memory structure according to an embodiment of the invention. The memory cell region in FIG. 2A to FIG. 2H is depicted along the section line I-I' in FIG. 1. Some components in FIG. 2A to FIG. 2H are omitted in FIG. 1 to clearly illustrate the positional relationship between the components in FIG. 1.

Figure 2A:
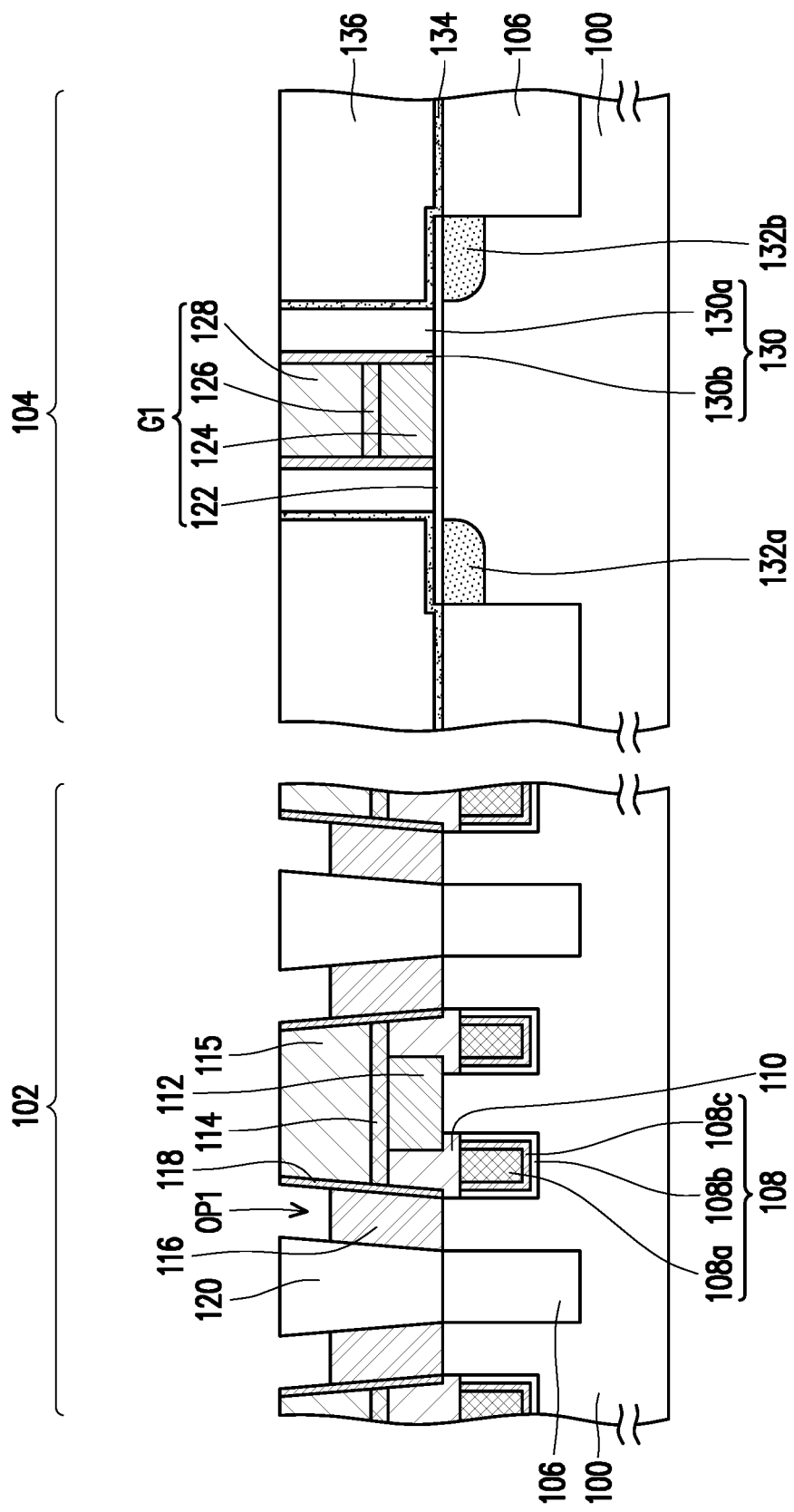
FIG. 2A to FIG. 2H are cross-sectional views illustrating a manufacturing process of a memory structure according to an embodiment of the invention.

Referring to FIG. 1 and FIG. 2A, a substrate 100 is provided. The substrate 100 includes a memory cell region 102 and a peripheral circuit region 104. The memory cell region 102 can be used to form a memory cell (e.g., a dynamic random access memory cell (DRAM cell)), and the peripheral circuit region 104 can be used to form a transistor. The substrate 100 is, for example, a semiconductor substrate such as a silicon substrate. An isolation structure 106 is located in the substrate 100. The isolation structure 106 is, for example, a shallow trench isolation (STI) structure. The material of the isolation structure 106 is, for example, silicon oxide.

A buried conductive structure 108 is formed in the substrate 100 of the memory cell region 104. The buried conductive structure 108 may include a buried word line 108a and a dielectric layer 108b. The buried word line 108a is located in the substrate 100. The material of the buried word line 108a is, for example, tungsten (W), aluminum (Al), or copper (Cu). The dielectric layer 108b is located between the buried word line 108a and the substrate 100. The material of the dielectric layer 108b is, for example, silicon oxide. Furthermore, the buried conductive structure 108 may further include a barrier layer 108c. The barrier layer 108c is located between the buried word line 108a and the dielectric layer 108b. The material of the barrier layer 108c is, for example, titanium (Ti), titanium nitride (TiN), tantalum (Ta), tantalum nitride (TaN), or a combination thereof. Moreover, a cap layer 110 may be formed on the buried conductive structure 108. The material of the cap layer 110 is, for example, silicon nitride.

A contact 112 is formed on the substrate 100 on one side of the buried conductive structure 108. The contact 112 can serve as a bit line contact. The material of the contact 112 is, for example, doped polysilicon. A conductive line 114 coupled to the contact 112 is formed. The conductive line 114 can serve as a bit line. The material of the conductive line 114 is, for example, tungsten, aluminum, or copper. In some embodiments, a barrier layer (not shown) may be formed between the conductive line 114 and the contact 112, but the invention is not limited thereto. Furthermore, a hard mask layer 115 may be formed on the conductive line 114. The material of the hard mask layer 115 is, for example, silicon nitride.

After the conductive line 114 is formed, a contact 116 is formed on the substrate 100 on another side of the buried conductive structure 108. The contact 116 can serve as a storage node contact. The material of the contact 116 is, for example, doped polysilicon. Additionally, a liner layer 118 may be formed on one side of the contact 116, and the liner layer 118 is located between the contact 116 and the conductive line 114. The material of the liner layer 118 is, for example, silicon nitride. Furthermore, a dielectric layer 120 may be formed on another side of the contact 116. The material of the dielectric layer 120 is, for example, silicon nitride. The top of the contact 116 is lower than the top of the liner layer 118 and the top of the dielectric layer 120, so that an opening OP1 is formed between the liner layer 118 and the dielectric layer 120.

A gate dielectric layer 122 is formed on the substrate 100 of the peripheral circuit region 104. The material of the gate dielectric layer 122 is, for example, silicon oxide. A doped polysilicon layer 124 is formed on the gate dielectric layer 122. The doped polysilicon layer 124 may be insulated from the substrate 100 by the gate dielectric layer 122. A metal layer 126 may be formed on the doped polysilicon layer 124. The material of the metal layer 126 is, for example, tungsten. In addition, a barrier layer (not shown) may be formed between the metal layer 126 and the doped polysilicon layer 124, but the invention is not limited thereto. A hard mask layer 128 is formed on the metal layer 126. The material of the hard mask layer 128 is, for example, silicon nitride. In some embodiments, the doped polysilicon layer 124 in the peripheral circuit region 104 and the contact 112 in the memory cell region 102 are, for example, formed by the same material layer. The metal layer 126 in the peripheral circuit region 104 and the conductive line 114 in the memory cell region 102 are, for example, formed by the same material layer. The hard mask layer 128 in the peripheral circuit region 104 and the hard mask layer 115 in the memory cell region 102 are, for example, formed by the same material layer.

In the present embodiment, the gate G1 may include the doped polysilicon layer 124, the metal layer 126, the hard mask layer 128, and the gate dielectric layer 122. The metal layer 126 is located on the doped polysilicon layer 124. The hard mask layer 128 is located on the metal layer 126. The gate dielectric layer 122 is located between the doped polysilicon layer 124 and the substrate 100.

A spacer 130 may be formed on the sidewall of the doped polysilicon layer 124. The spacer 130 may be a single layer structure or a multilayer structure. For example, the spacer 130 may include a spacer 130a and a spacer 130b. The spacer 130a is located on the sidewall of the doped polysilicon layer 124, and the spacer 130b is located between the spacer 130a and the doped polysilicon layer 124. The material of the spacer 130a is, for example, silicon oxide. The material of the spacer 130b is, for example, silicon nitride. In the present embodiment, the spacer 130 is exemplified by two layers, but the invention is not limited thereto.

A doped region 132a and a doped region 132b are formed in the substrate 100 on two sides of the gate G1. The doped region 132a and the doped region 132b can respectively serve as the source and the drain of the transistor. The method of forming the doped region 132a and the doped region 132b is, for example, a plasma doping (PLAD) method, whereby the parasitic capacitance can be reduced and the drain induced barrier lowering (DIBL) can be prevented.

Furthermore, a dielectric layer 134 may be formed on the sidewall of the spacer 130a and the gate dielectric layer 122. The material of the dielectric layer 134 is, for example, silicon nitride. A dielectric layer 136 is formed on the dielectric layer 134 on two sides of the gate G1. The material of the dielectric layer 136 is, for example, silicon oxide.

Figure 2B:
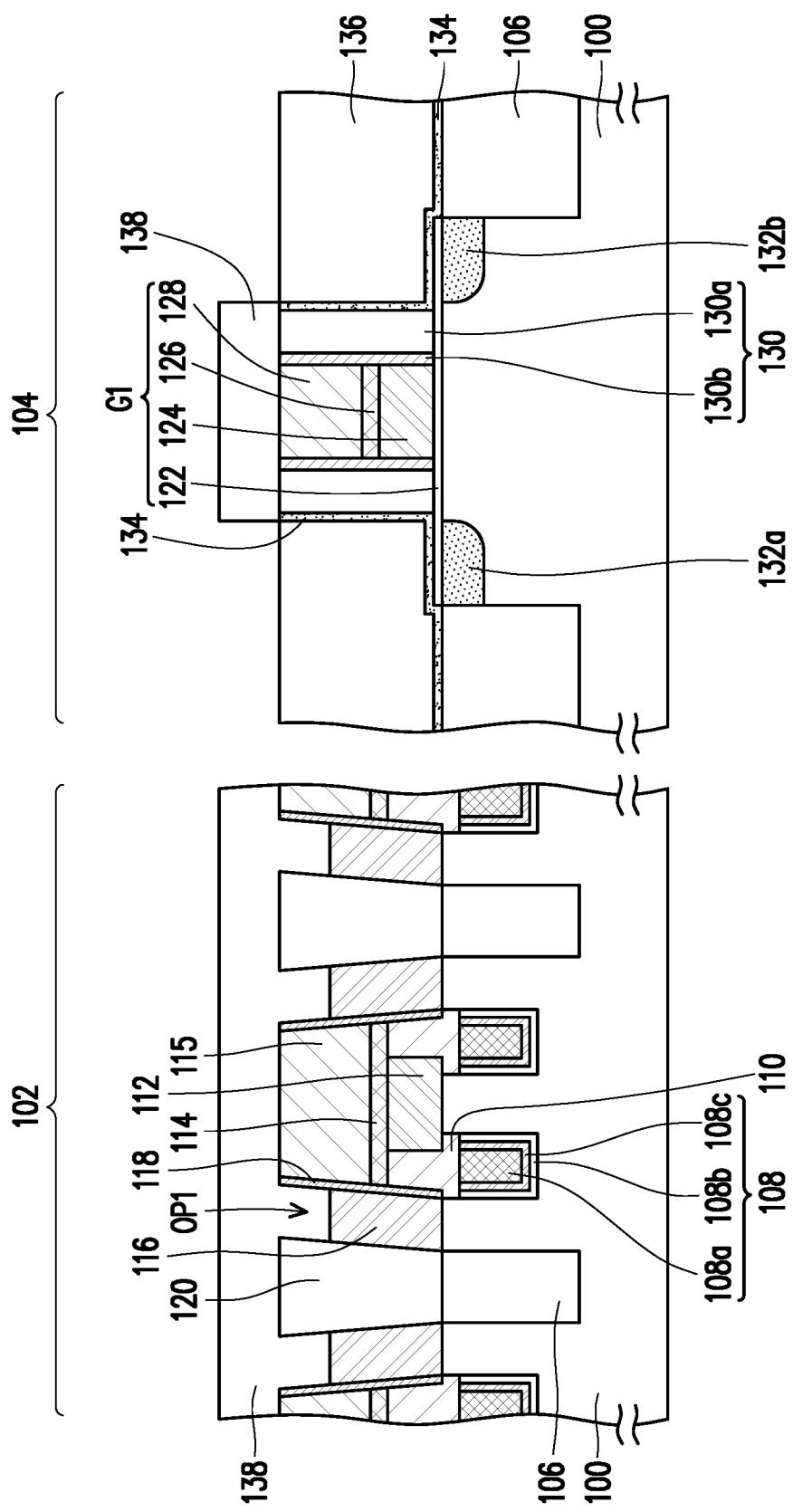

Referring to FIG. 2B, a patterned photoresist layer 138 exposing the dielectric layer 136 is formed.

Figure 2C:
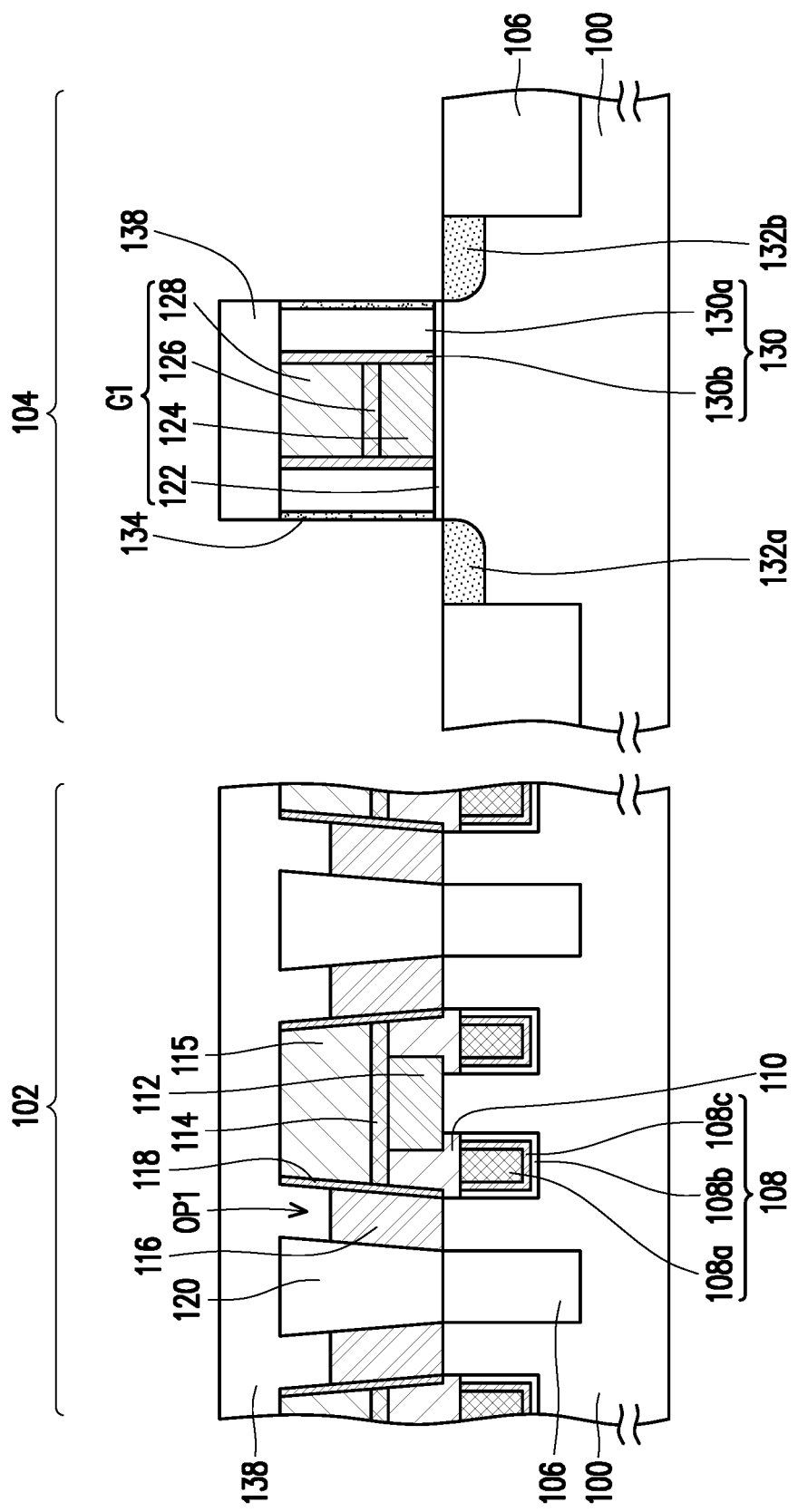

Referring to FIG. 2C, the dielectric layer 136, a portion of the dielectric layer 134, and a portion of the gate dielectric layer 122 are removed by using the patterned photoresist layer 138 as a mask, and the doped region 132a and the doped region 132b are exposed. The method of removing the dielectric layer 136 is, for example, a wet etching method. The method of removing a portion of the dielectric layer 134 is, for example, a dry etching method. The method of removing a portion of the gate dielectric layer 122 is, for example, a dry etching method or a wet etching method.

Figure 2D:
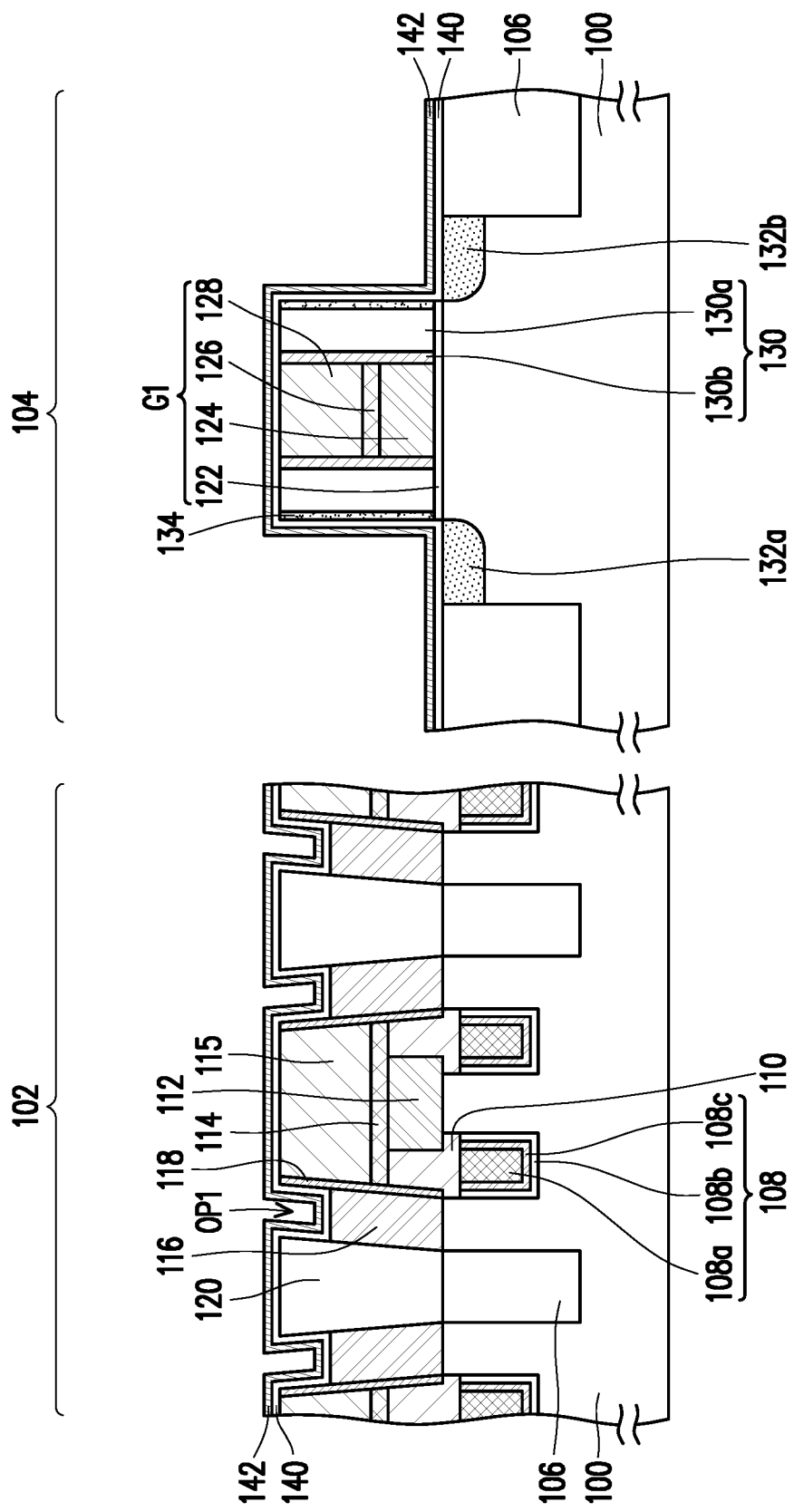

Referring to FIG. 2D, the patterned photoresist layer 138 is removed. The method of removing the patterned photoresist layer 138 is, for example, a dry stripping method or a wet stripping method.

In the present embodiment, an aluminum layer 140 may be formed on the doped region 132a and the doped region 132b, but the invention is not limited thereto. Moreover, the aluminum layer 140 may be further formed on the contact 116. The method of forming the aluminum layer 140 is, for example, a physical vapor deposition (PVD) method. A nickel layer 142 is formed on the aluminum layer 140. The nickel layer 142 is located above the doped region 132a and the doped region 132b and further located above the contact 116. The method of forming the nickel layer 142 is, for example, a PVD method.

Figure 2E:
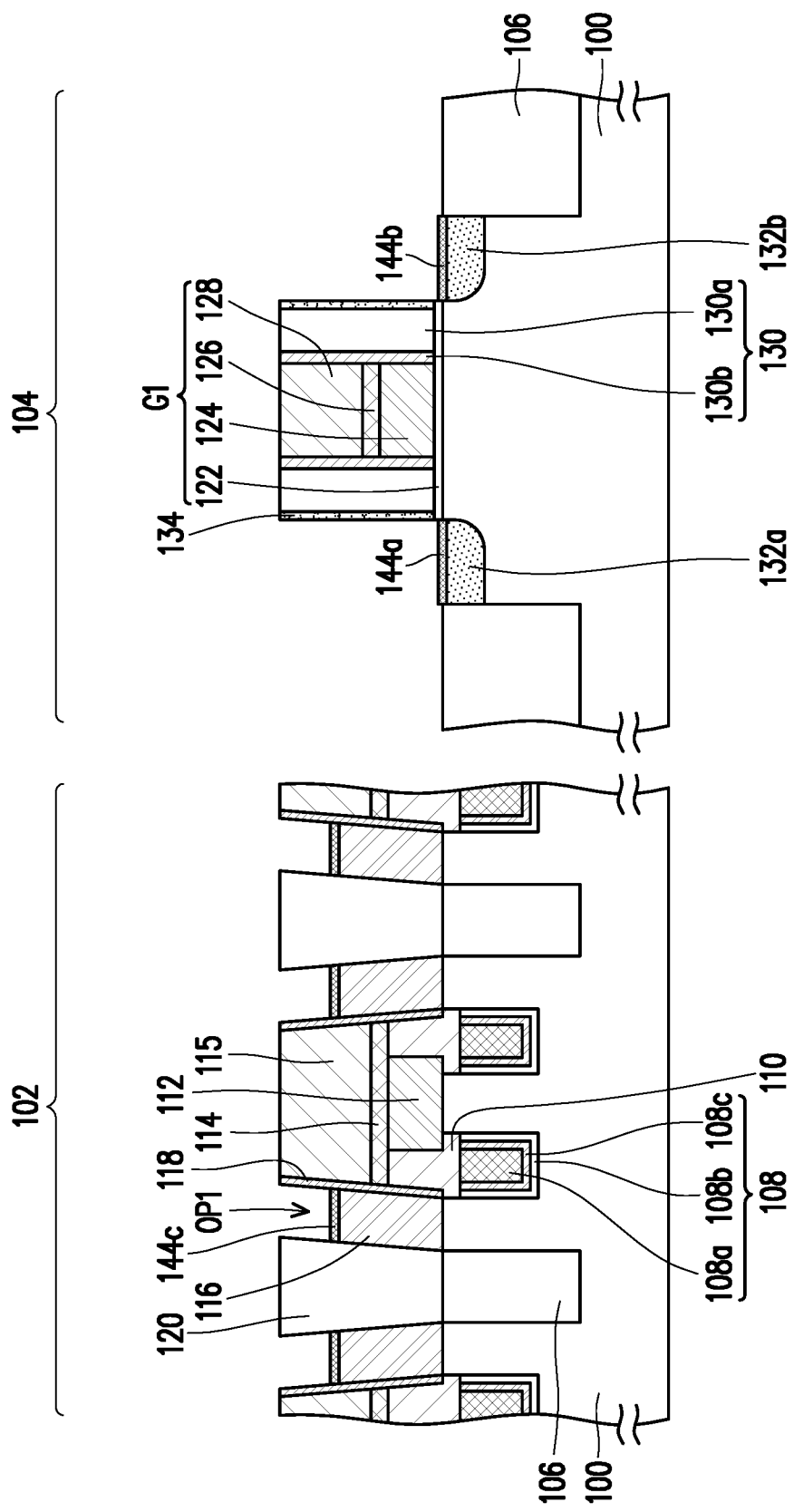

Referring to FIG. 2E, a thermal process is performed to react the nickel layer 142 with the substrate 100 to form nickel silicide layers 144a, 144b. The nickel silicide layer 144a is located on the doped region 132a, and the nickel silicide layer 144b is located on the doped region 132b. The unreacted nickel layer 142 and the aluminum layer 140 are removed. The method of removing the unreacted nickel layer 142 and the aluminum layer 140 is, for example, a wet etching method.

Furthermore, a metal silicide layer 144c may be simultaneously formed on the contact 116 in the step of forming the nickel silicide layers 144a, 144b, but the invention is not limited thereto. The metal silicide layer 144c is, for example, a nickel silicide layer. In some embodiments, the metal silicide layer 144c may be formed separately and may have a material (e.g., cobalt silicide (CoSi) or nickel silicide (NiSi)) the same as or different from the material of the nickel silicide layers 144a, 144b. In the present embodiment, the nickel silicide layers 144a, 144b and the metal silicide layer 144c may be salicide layers formed by a salicidation (self-aligned silicidation) process.

In the present embodiment, since the aluminum layer 140 is located between the nickel layer 142 and the substrate 100 and between the nickel layer 142 and the contact 116, the nickel silicide layers 144a, 144b and the metal silicide layer 144c formed by the salicidation process may contain aluminum. Thereby, the heat resistance of the nickel silicide layers 144a, 144b and the metal silicide layer 144c can be enhanced. In some embodiments, the aluminum layer 140 may not be formed, and the nickel silicide layers 144a, 144b and the metal silicide layer 144c may be free of aluminum.

Furthermore, the method of improving the heat resistance of the nickel silicide layers 144a, 144b and the metal silicide layer 144c is not limited to the above method. In some embodiments, the target for forming the nickel layer 142 is, for example, a NiPt target, and the content of Pt in the NiPt target is, for example, greater than 5% and less than or equal to 50%. Thereby, the heat resistance of the nickel silicide layers 144a, 144b and the metal silicide layer 144c can be enhanced.

Figure 2F:
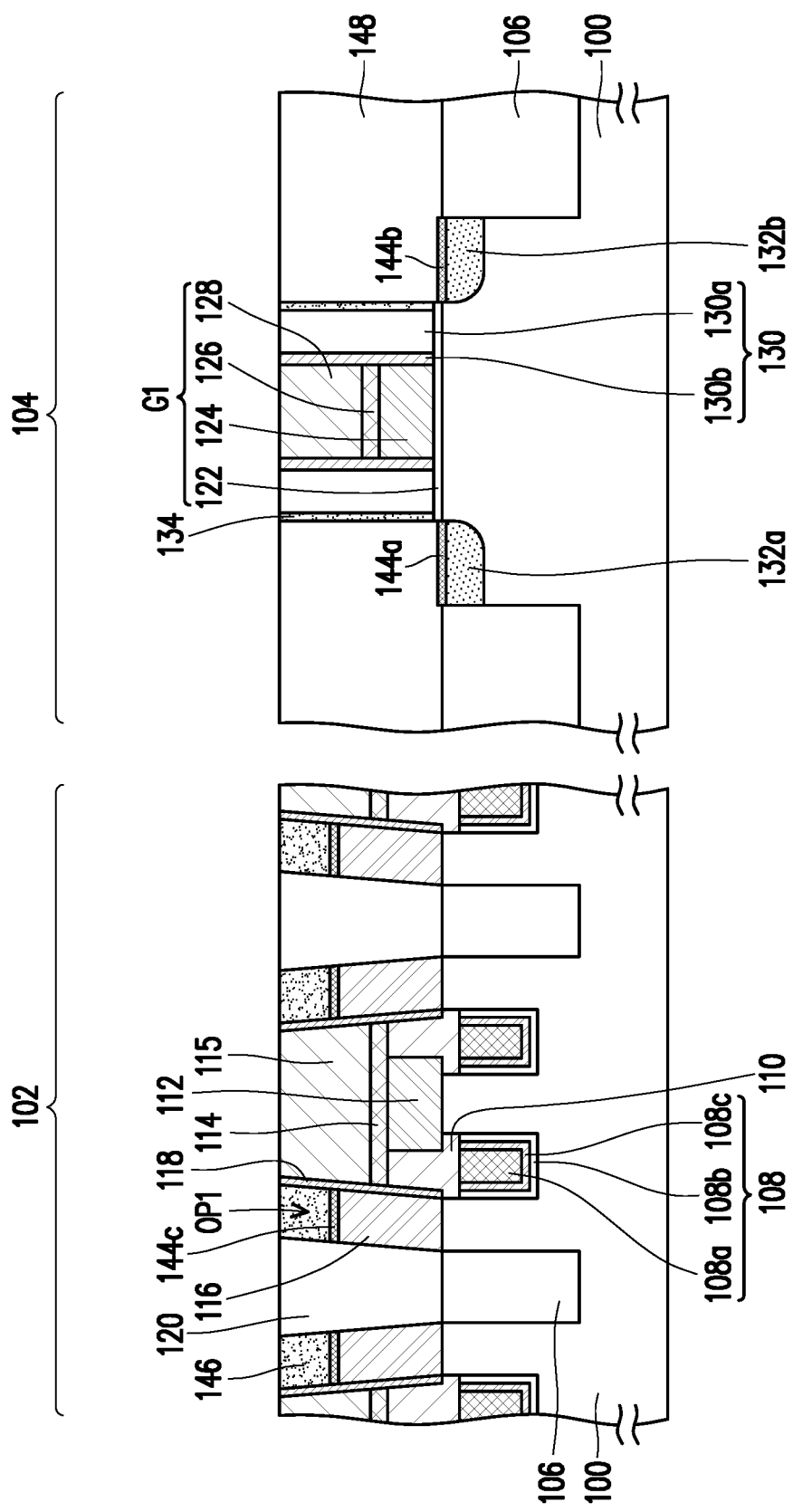

Referring to FIG. 2F, a protection layer 146 is formed in the opening OP1. The material of the protection layer 146 is, for example, amorphous carbon. The method of forming the protection layer 146 is, for example, forming a protection material layer (not shown) in the memory cell region 102, and then removing the protection material layer outside the opening OP1 by the etching back process.

A dielectric layer 148 covering the nickel silicide layers 144a, 144b is formed in the peripheral circuit region 104. The material of the dielectric layer 148 is, for example, silicon oxide. The method of forming the dielectric layer 148 is, for example, forming a dielectric material layer (not shown) in the memory cell region 102 and the peripheral circuit region 104, and then performing a chemical mechanical polishing (CMP) process on the dielectric material layer until exposing the hard mask layer 128 in the peripheral circuit region 104 and the protection layer 146 in the memory cell region 102, but the invention is not limited thereto.

Figure 2G:
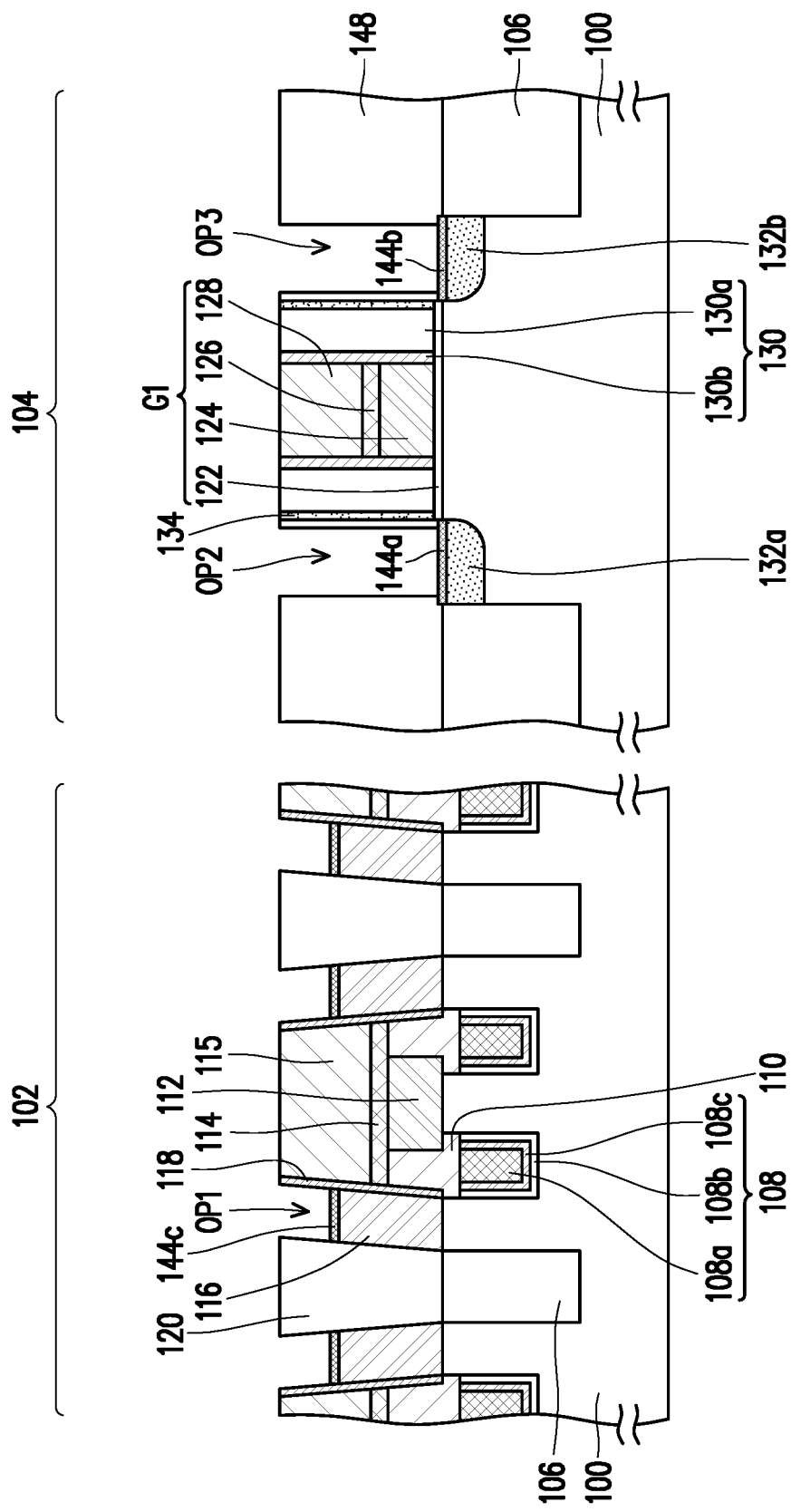

Referring to FIG. 2G, the protection layer 146 is removed to form the opening OP1. The method of removing the protection layer 146 is, for example, an ashing method. An opening OP2 exposing the nickel silicide layer 144a and an opening OP3 exposing the nickel silicide layer 144b are formed in the dielectric layer 148. The method of forming the opening OP2 and the opening OP3 is, for example, patterning the dielectric layer 148 by a lithography process and an etching process.

Figure 2H:
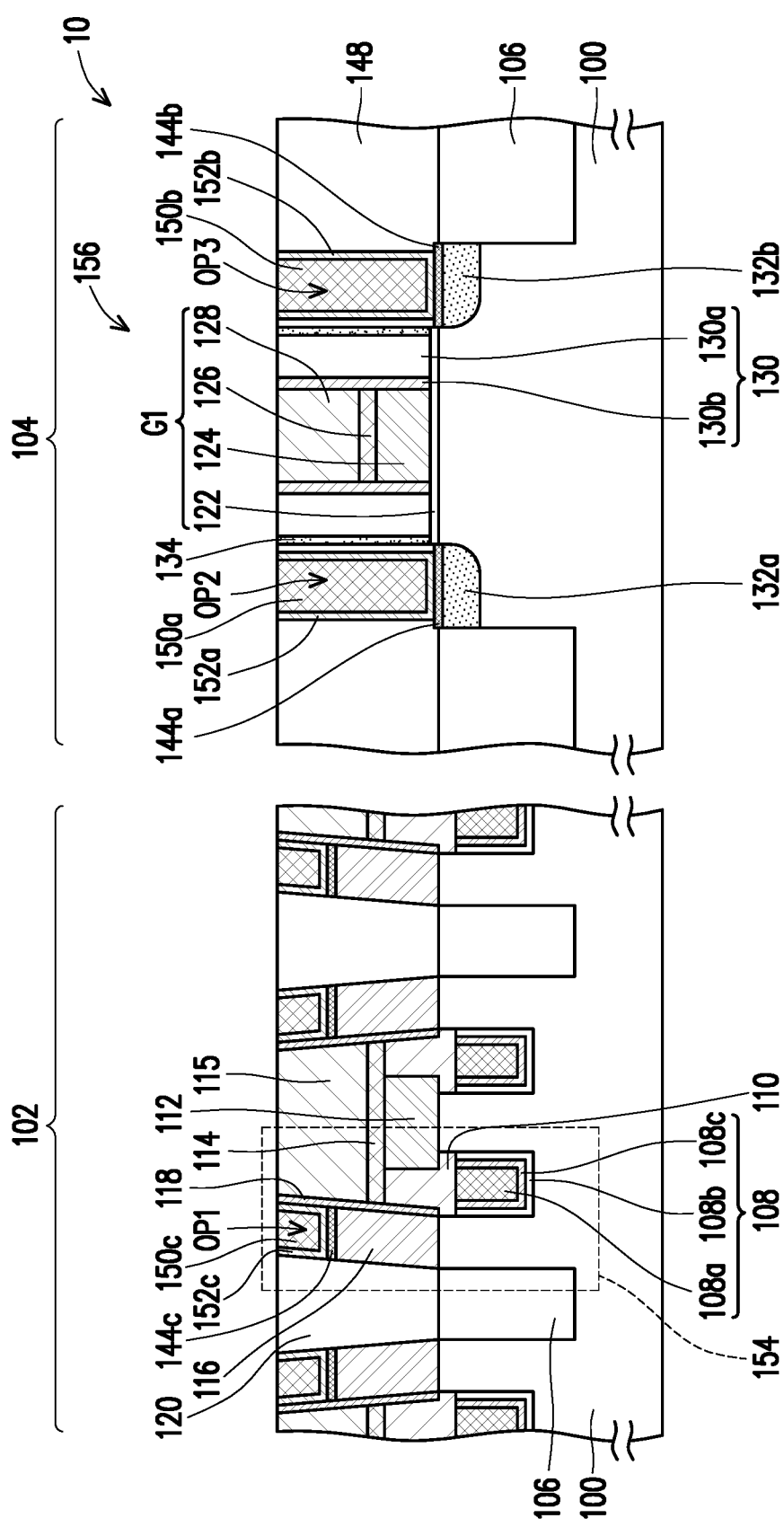

Referring to FIG. 2H, a contact 150a and a contact 150b are respectively formed in the opening OP2 and the opening OP3. In the present embodiment, the contacts 150a, 150b are formed after the nickel silicide layers 144a, 144b are formed. A contact 150c may be simultaneously formed in the opening OP1 in the step of forming the contact 150a and the contact 150b. The contact 150a, the contact 150b, and the contact 150c are electrically connected to the nickel silicide layer 144a, the nickel silicide layer 144b, and metal silicide layer 144c, respectively. The material of the contact 150a, the contact 150b, and the contact 150c is, for example, tungsten, aluminum, or copper.

Moreover, a barrier layer 152a, a barrier layer 152b, and a barrier layer 152c may be formed between the contact 150a and the nickel silicide layer 144a, between the contact 150b and the nickel silicide layer 144b, and between the contact 150c and the metal silicide layer 144c, respectively. The material of the barrier layers 152a, 152b, 152c is, for example, Ti, TiN, Ta, TaN, or a combination thereof.

In the present embodiment, the method of forming the contacts 150a to 150c and the barrier layers 152a to 152c may include the following steps, but the invention is not limited thereto. A barrier material layer (not shown) is conformally formed in the opening OP1, the opening OP2, and the opening OP3. A contact material layer (not shown) filling the openings OP1, OP2 and OP3 is formed on the barrier material layer. The contact material layer and the barrier material layer outside the openings OP1, OP2, OP3 may be removed by a CMP process.

In addition, the above method may form a memory cell 154 in the memory cell region 102 and may form a transistor 156 in the peripheral circuit region 104, thereby forming a memory structure 10. Hereinafter, the memory structure 10 of the present embodiment will be described with reference to FIG. 2H.

Referring to FIG. 2H, the memory structure 10 includes the substrate 100, the memory cell 154, and the transistor 156. The substrate 100 includes the memory cell region 102 and the peripheral circuit region 104. The memory cell 154 is located in the memory cell region 102. The memory cell 154 may include the buried conductive structure 108, the contact 112, the conductive line 114, the contact 116, and the contact 150c. The memory cell 154 may further include at least one of the cap layer 110, the hard mask layer 115, the liner layer 118, the dielectric layer 120, the metal silicide layer 144c, and the barrier layer 152c. However, the structure of the memory cell 154 of the invention is not limited thereto. For example, when the memory cell 154 is a DRAM cell, the memory cell 154 may further include a capacitor (not shown) electrically connected to the contact 150c. Furthermore, the material, the formation method, and the arrangement of each component in the memory cell 154 have been described in detail in the above embodiments, and the description thereof is not repeated herein.

The transistor 156 is located in the peripheral circuit region 104. The transistor 156 includes the gate G1, the doped region 132a, the doped region 132b, the nickel silicide layer 144a, and the nickel silicide layer 144b. The gate G1 is located on the substrate 100 and is insulated from the substrate 100. The gate G1 may include the doped polysilicon layer 124, the metal layer 126, the hard mask layer 128, and the gate dielectric layer 122. The metal layer 126 is located on the doped polysilicon layer 124. The hard mask layer 128 is located on the metal layer 126. The gate dielectric layer 122 is located between the doped polysilicon layer 124 and the substrate 100, whereby the gate G1 can be insulated from the substrate 100. The doped region 132a and the doped region 132b are located in the substrate 100 on two sides of the gate G1. The nickel silicide layer 144a is located on the entire top surface of the doped region 132a. The nickel silicide layer 144b is located on the entire top surface of the doped region 132b.

The transistor 156 may further include at least one of the spacer 130, the dielectric layer 134, the dielectric layer 148, the contact 150a, the contact 150b, the barrier layer 152a, and the barrier layer 152b. The spacer 130 is located on the sidewall of the doped polysilicon layer 124. The spacer 130 may include the spacer 130a and the spacer 130b. The spacer 130a is located on the sidewall of the doped polysilicon layer 124. The spacer 130b is located between the spacer 130a and the doped polysilicon layer 124. The dielectric layer 134 is located on the spacer 130. The dielectric layer 148 is located on the substrate 100. The contact 150a and the contact 150b are located in the dielectric layer 148 and are electrically connected to the nickel silicide layer 144a and the nickel silicide layer 144b, respectively. The barrier layer 152a is located between the contact 150a and the nickel silicide layer 144a. The barrier layer 152b is located between the contact 150b and the nickel silicide layer 144b.

Furthermore, the material, the formation method, and the efficacy of each component in transistor 156 have been described in detail in the above embodiments, and the description thereof is not repeated herein.

Based on the aforementioned embodiment, in the memory structure 10 and the manufacturing method thereof, since the nickel silicide layers 144a, 144b are respectively located on the doped regions 132a, 132b, the transistor 156 in the peripheral circuit region 104 can have lower resistance and larger saturation current. Thereby, the performance of the transistor 156 can be effectively improved. Thus, the electrical performance of the memory structure 10 can be improved.

Figure 3:
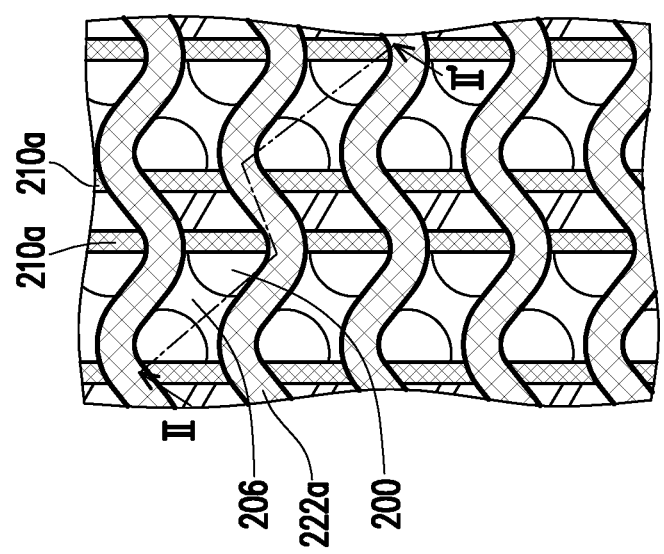
FIG. 3 is a top view illustrating some components in a memory cell region of a memory structure according to another embodiment of the invention.

FIG. 3 is a top view illustrating some components in a memory cell region of a memory structure according to another embodiment of the invention. FIG. 4A to FIG. 4I are cross-sectional views illustrating a manufacturing process of a memory structure according to another embodiment of the invention. The memory cell region in FIG. 4A to FIG. 4I is depicted along the section line II-II' in FIG. 3. Some components in FIG. 4A to FIG. 4I are omitted in FIG. 3 to clearly illustrate the positional relationship between the components in FIG. 3. Furthermore, the conductive line 222a in FIG. 3 appears from FIG. 4C.

Figure 4A:
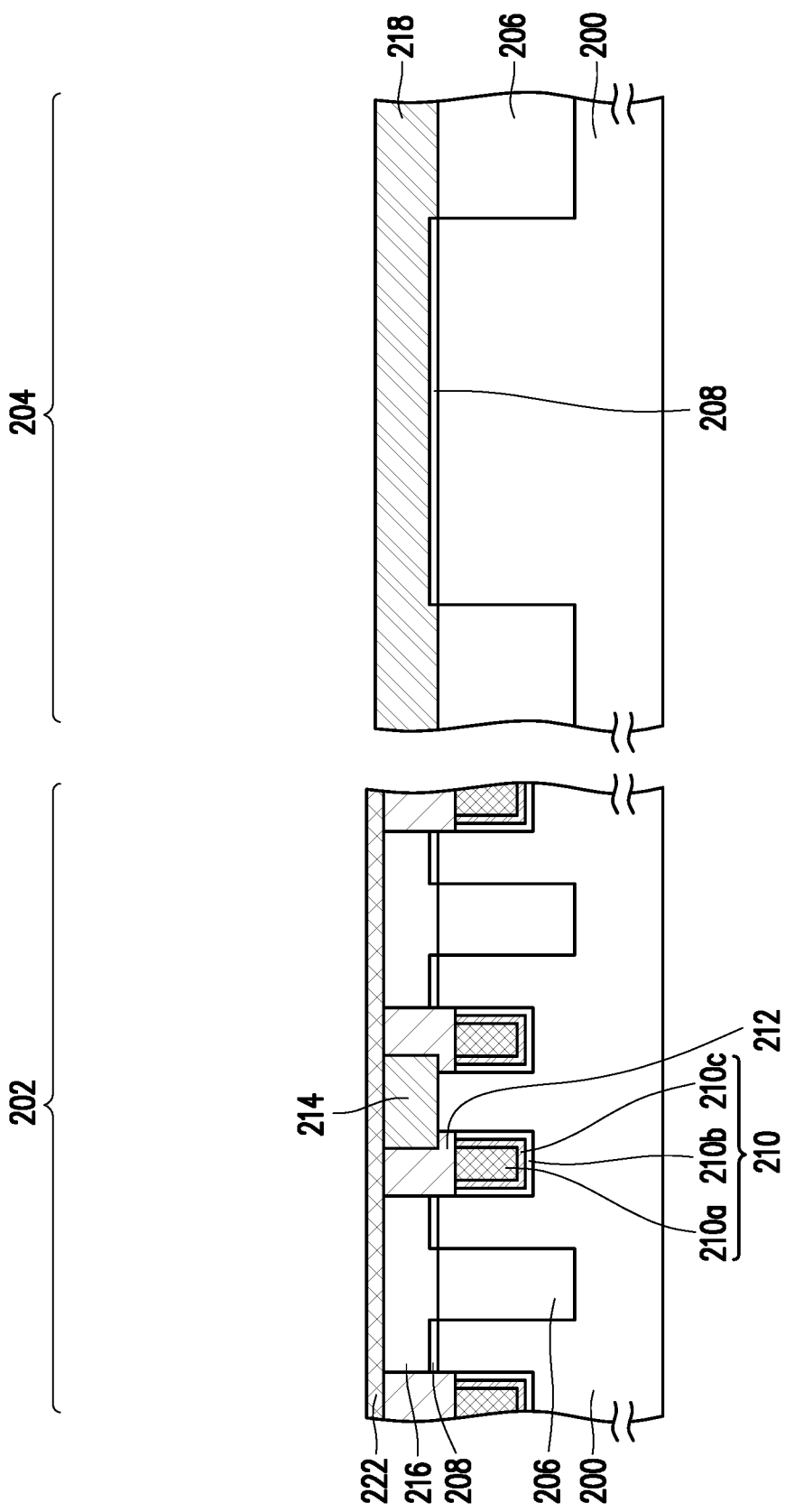
FIG. 4A to FIG. 4I are cross-sectional views illustrating a manufacturing process of a memory structure according to another embodiment of the invention.

Referring to FIG. 4A, a substrate 200 is provided. The substrate 200 includes a memory cell region 202 and a peripheral circuit region 204. The memory cell region 202 can be used to form a memory cell (e.g., a DRAM cell), and the peripheral circuit region 204 can be used to form a transistor. The substrate 200 is, for example, a semiconductor substrate such as a silicon substrate. The isolation structure 206 is located in the substrate 200. The isolation structure 206 is, for example, a STI structure. The material of the isolation structure 206 is, for example, silicon oxide. In addition, a gate dielectric layer 208 is formed on the substrate 200. The material of the gate dielectric layer 208 is, for example, silicon oxide. The method of forming the gate dielectric layer 208 is, for example, a thermal oxidation method.

A buried conductive structure 210 is formed in the substrate 200 of the memory cell region 202. The buried conductive structure 210 may include a buried word line 210a and a dielectric layer 210b. The buried word line 210a is located in the substrate 200. The material of the buried word line 210a is, for example, tungsten, aluminum, or copper. The dielectric layer 210b is located between the buried word line 210a and the substrate 200. The material of the dielectric layer 210b is, for example, silicon oxide. Furthermore, the buried conductive structure 210 may further include a barrier layer 210c. The barrier layer 210c is located between the buried word line 210a and the dielectric layer 210b. The material of the barrier layer 210c is, for example, Ti, TiN, Ta, TaN, or a combination thereof. Moreover, a cap layer 212 may be formed on the buried conductive structure 210. The material of the cap layer 212 is, for example, silicon nitride.

A contact 214 is formed on the substrate 200 on one side of the buried conductive structure 210. The contact 214 can serve as a bit line contact. The material of the contact 214 is, for example, doped polysilicon. Furthermore, a dielectric layer 216 may be formed on the substrate 200 on another side of the buried conductive structure 210. The material of the dielectric layer 216 is, for example, silicon oxide.

A gate material layer 218 is formed on the gate dielectric layer 208 in the peripheral circuit region 204. The material of gate material layer 218 is, for example, doped polysilicon. In some embodiments, the gate material layer 218 in the peripheral circuit region 204 and the contact 214 in the memory cell region 202 are, for example, formed by the same material layer.

A conductive layer 222 is formed on the contact 214 in the memory cell region 202. The material of the conductive layer 222 is, for example, tungsten, aluminum or copper. In some embodiments, a barrier layer (not shown) may be formed between the conductive layer 222 and the contact 214, but the invention is not limited thereto.

Figure 4B:
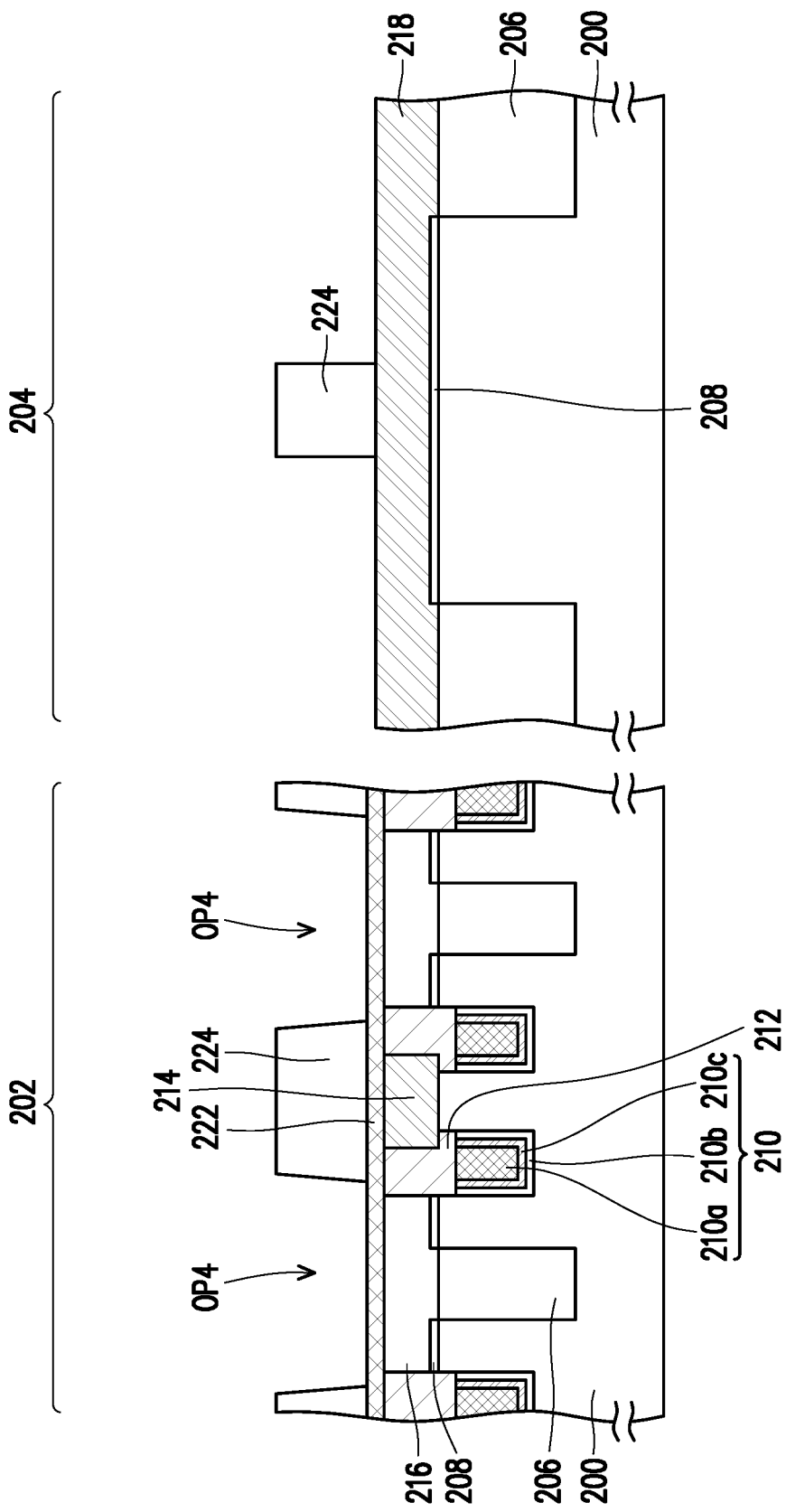

Referring to FIG. 4B, a hard mask layer 224 is formed on the gate material layer 218 and the conductive layer 222, and the hard mask layer 224 in the memory cell region 202 has an opening OP4. The material of the hard mask layer 224 is, for example, silicon nitride. The method of forming the hard mask layer 224 is, for example, a combination of a deposition process, a lithography process, and an etching process.

Figure 4C:
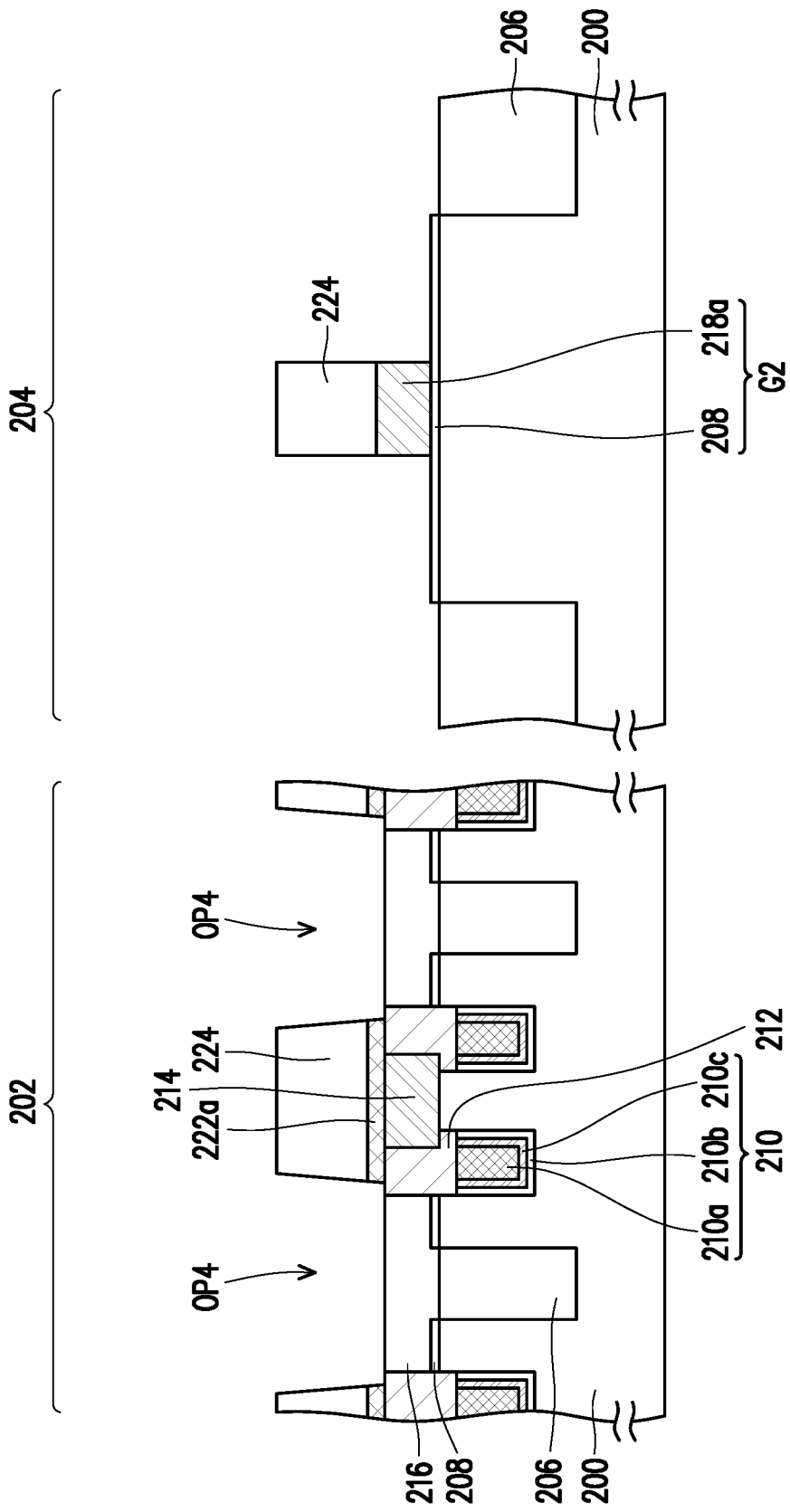

Referring to FIG. 3 and FIG. 4C, a portion of the gate material layer 218 and a portion of the conductive layer 222 are removed by using the hard mask layer 224 as a mask, so that a conductive line 222a is formed in the memory cell region 202, and a doped polysilicon layer 218a is formed in the peripheral circuit region 204. The conductive line 222a can serve as a bit line. The method of removing a portion of the gate material layer 218 and a portion of the conductive layer 222 is, for example, a dry etching method.

In the present embodiment, the gate G2 may include a doped polysilicon layer 218a and a gate dielectric layer 208. The gate dielectric layer 208 is located between the doped polysilicon layer 218a and the substrate 200.

Figure 4D:
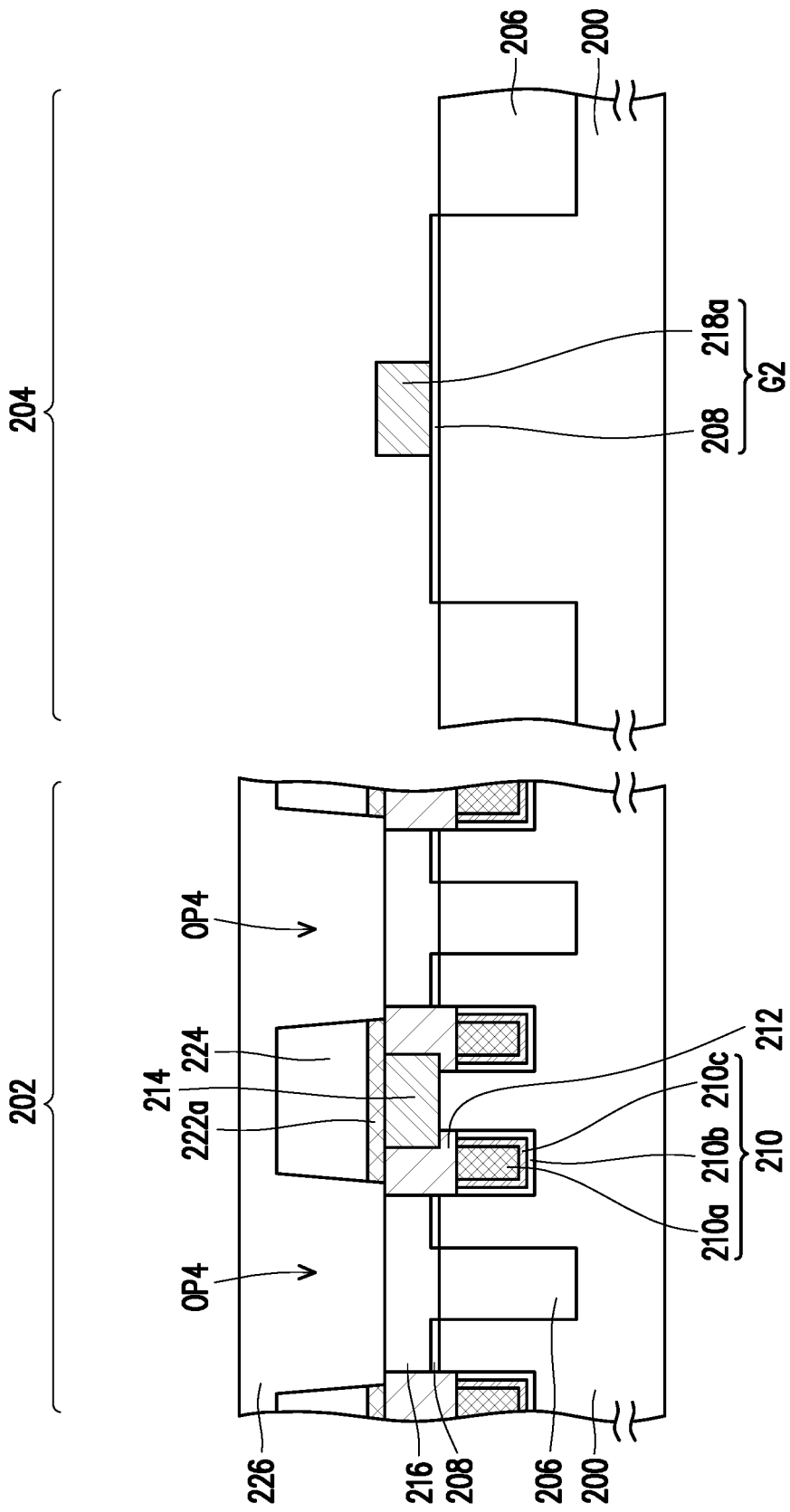

Referring to FIG. 4D, a patterned photoresist layer 226 covering the hard mask layer 224 is formed in the memory cell region 202, and the patterned photoresist layer 226 is filled in the opening OP4. The hard mask layer 224 in the peripheral circuit region 204 is removed by using the patterned photoresist layer 226 as a mask. The method of removing the hard mask layer 224 in the peripheral circuit region 204 is, for example, a dry etching process or a wet etching process.

Figure 4E:
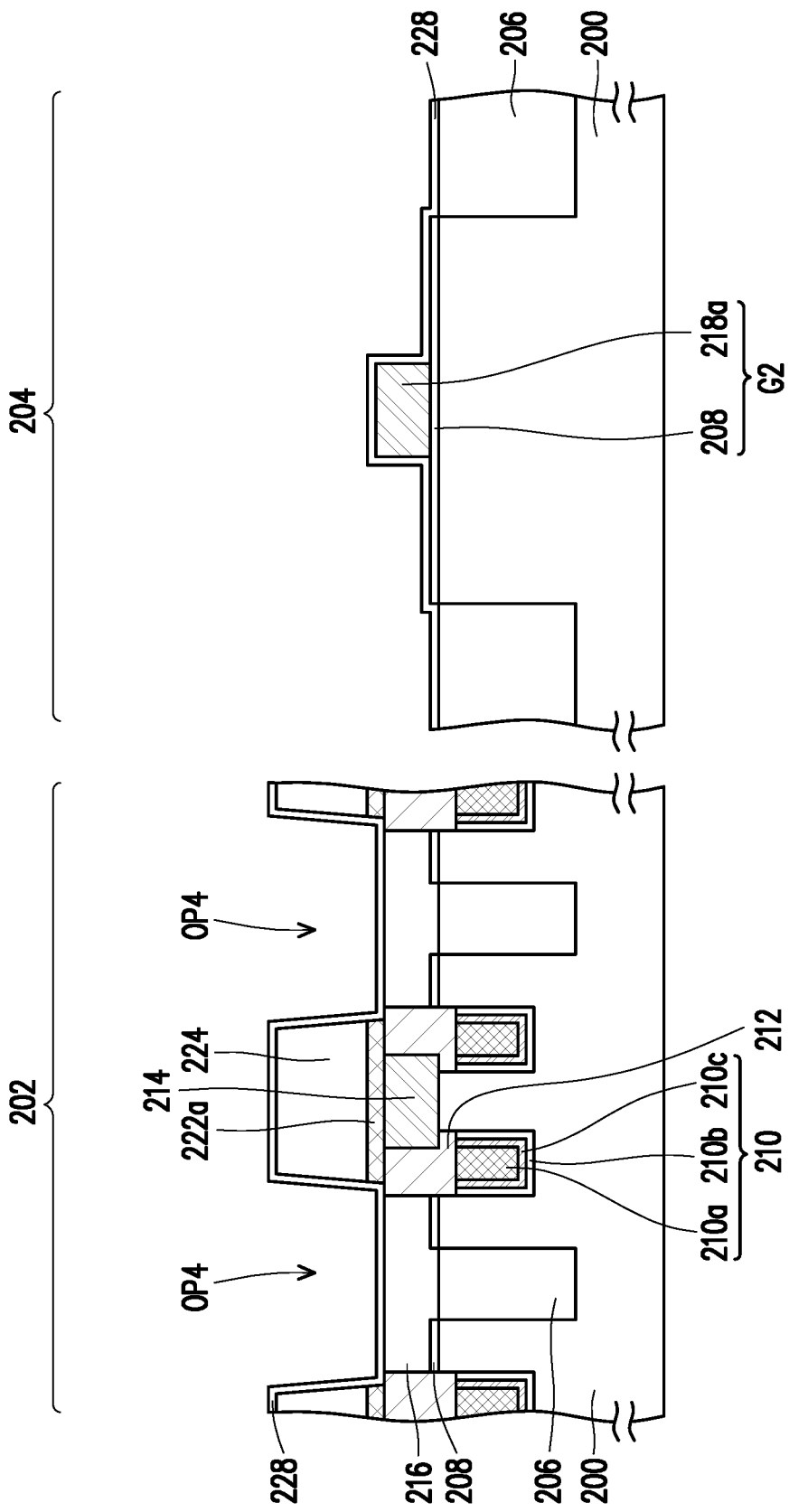

Referring to FIG. 4E, the patterned photoresist layer 226 is removed. The method of removing the patterned photoresist layer 226 is, for example, a dry stripping method or a wet stripping method.

A spacer material layer 228 is conformally formed on the gate G2 and the hard mask layer 224. The material of the spacer material layer 228 is, for example, silicon nitride. The method of forming the spacer material layer 228 is, for example, a chemical vapor deposition (CVD) method.

Figure 4F:
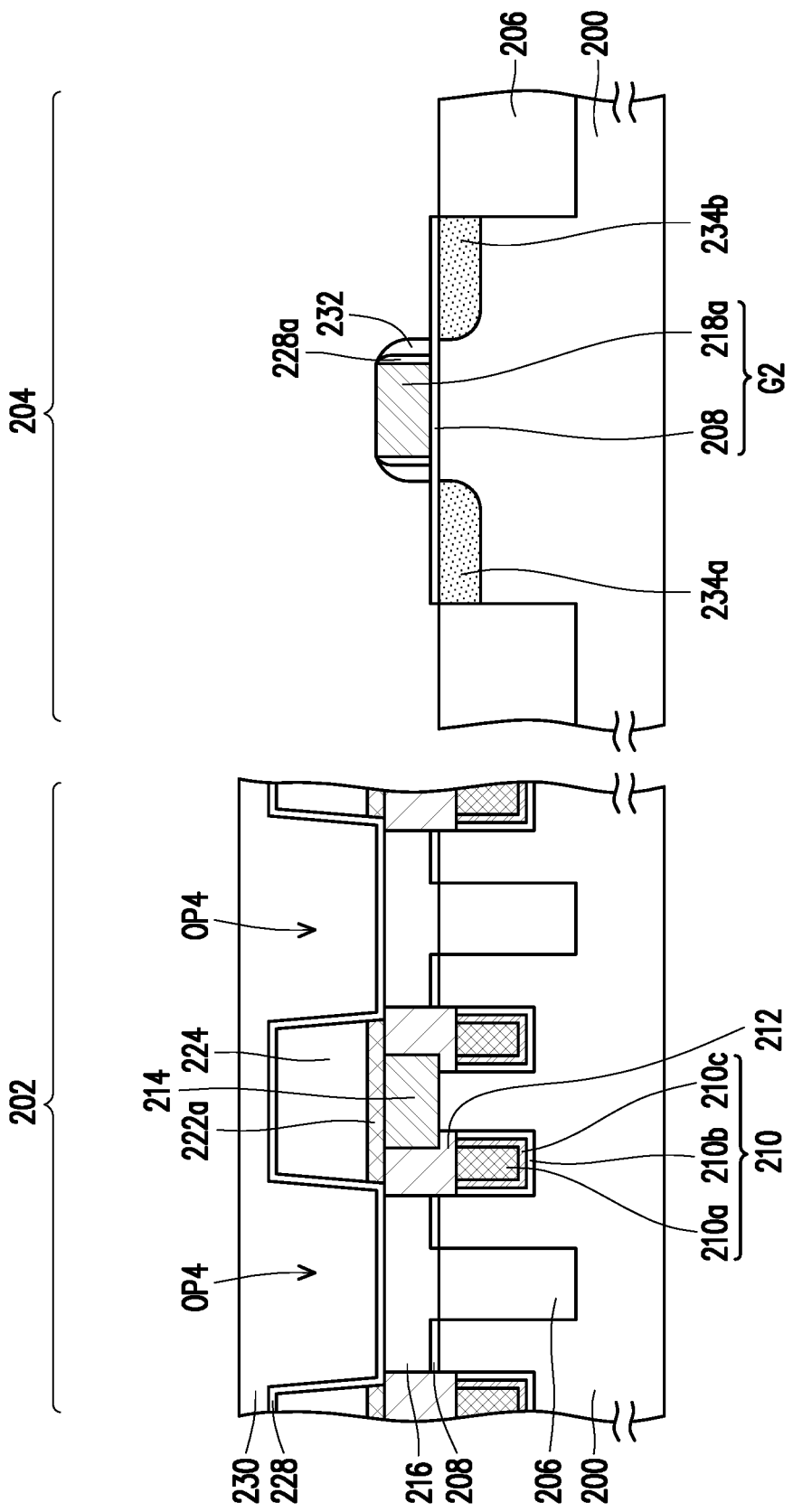

Referring to FIG. 4F, a patterned photoresist layer 230 is formed on the spacer material layer 228 in the memory cell region 202, and the patterned photoresist layer 230 is filled in the opening OP4. An etching back process is performed on the spacer material layer 228 in the peripheral circuit region 204 by using the patterned photoresist layer 230 as a mask, so that a spacer 228a is formed on the sidewall of the doped polysilicon layer 218a.

A spacer 232 is formed on the sidewall of the spacer 228a. The material of the spacer 232 is, for example, silicon oxide. The method of forming the spacer 232 is, for example, forming a spacer material layer (not shown) covering the doped polysilicon layer 218a and the spacer 228a, and then performing an etching back process on the spacer material layer.

A doped region 234a and a doped region 234b are formed in the substrate 200 on two sides of the gate G2. The doped region 234a and the doped region 234b can respectively serve as the source and the drain of the transistor. The method of forming the doped region 234a and the doped region 234b is, for example, a plasma doping (PLAD) method, whereby the parasitic capacitance can be reduced and the drain induced barrier lowering (DIBL) can be prevented.

Figure 4G:
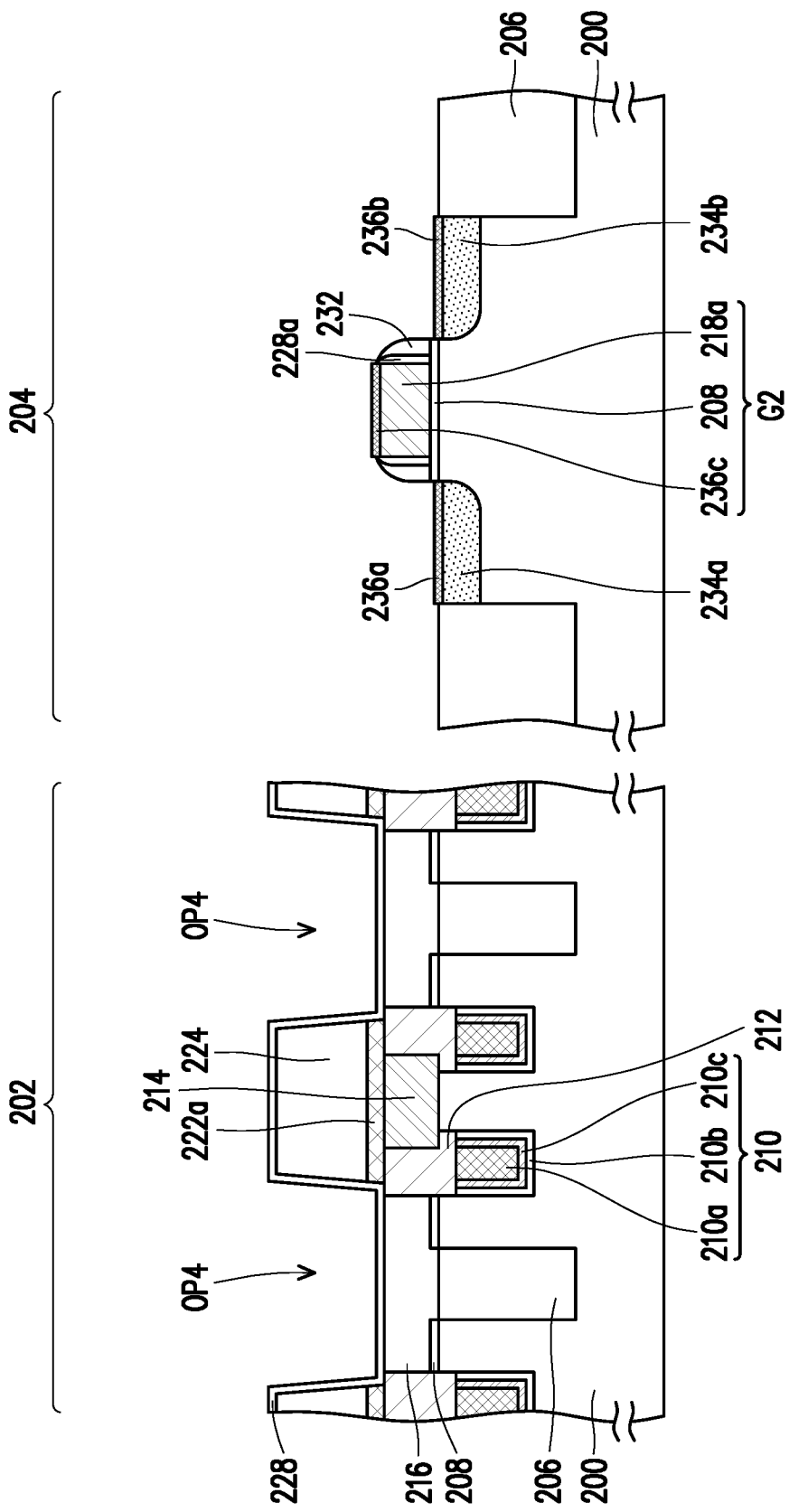

Referring to FIG. 4G, the patterned photoresist layer 230 is removed. The method of removing the patterned photoresist layer 230 is, for example, a dry stripping method or a wet stripping method. A portion of the gate dielectric layer 208 is removed to expose the doped region 234a and the doped region 234b. The method of removing a portion of gate dielectric layer 208 is, for example, a dry etching method or a wet etching method.

A nickel silicide layer 236a and a nickel silicide layer 236b are respectively formed on the doped region 234a and the doped region 234b. A nickel silicide layer 236c may be simultaneously formed on the doped polysilicon layer 218a in the step of forming the nickel silicide layers 236a, 236b. In the present embodiment, the nickel silicide layers 236a, 236b, 236c may be salicide layers formed by a salicidation process. The method of forming the nickel silicide layers 236a, 236b, 236c may refer to the method of forming the nickel silicide layers 144a, 144b and the metal silicide layer 144c in FIG. 2D and FIG. 2E, and the description thereof is not repeated herein, but the invention is not limited thereto.

In the present embodiment, the gate G2 may further include the nickel silicide layer 236c. The nickel silicide layer 236c is located on the doped polysilicon layer 218a.

Figure 4H:
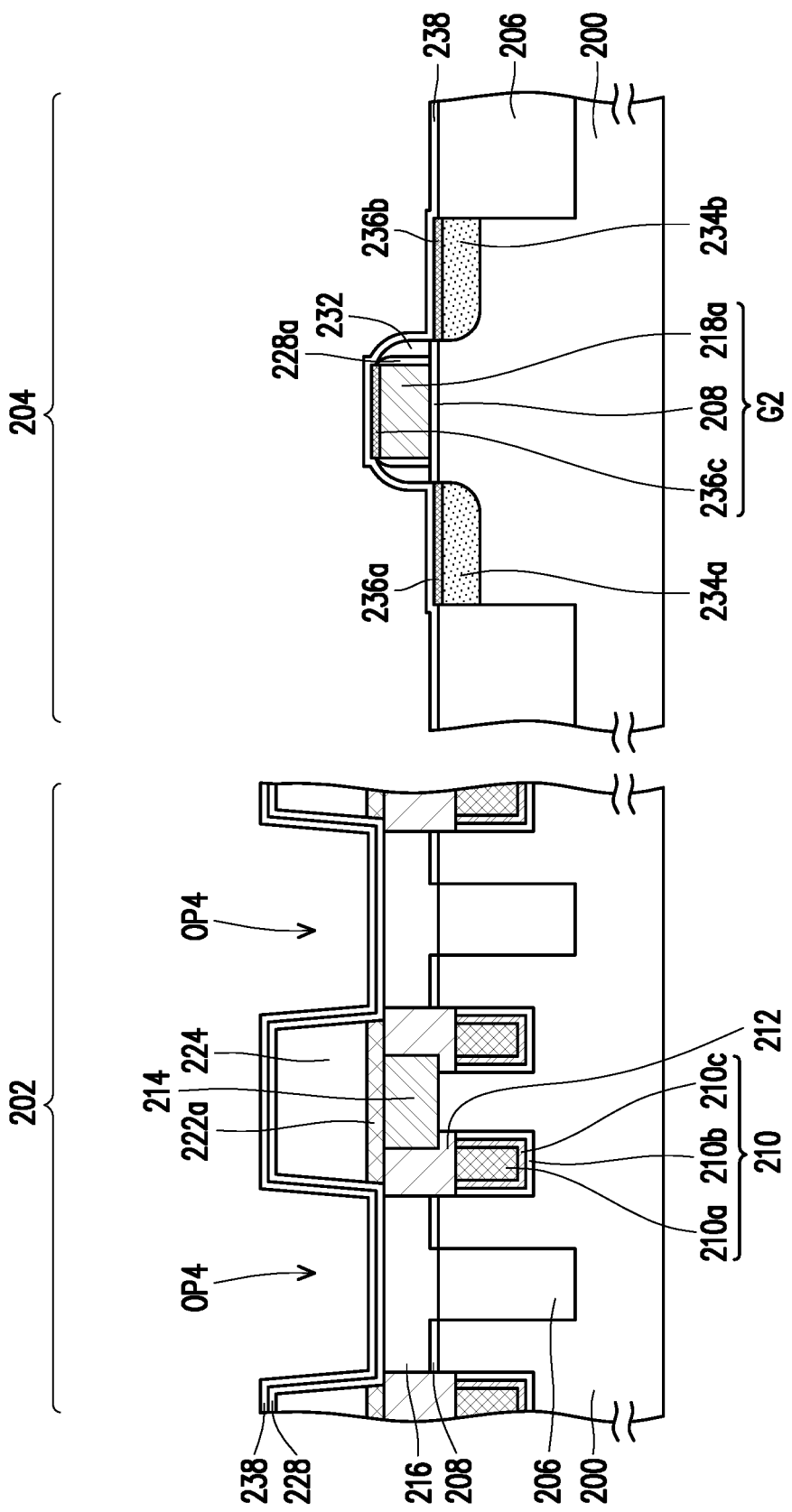

Referring to FIG. 4H, after the nickel silicide layers 236a, 236b, 236c are formed, a stress adjustment layer 238 covering the gate G2 may be formed. In the present embodiment, the stress adjustment layer 238 may be located on the surface of the substrate 200 of the peripheral circuit region 204 and the memory cell region 202. The material of the stress adjustment layer 238 is, for example, silicon nitride or silicon oxynitride. The method of forming the stress adjustment layer 238 is, for example, a CVD method. In some embodiments, the stress adjustment layer 238 may not be formed.

Figure 4I:
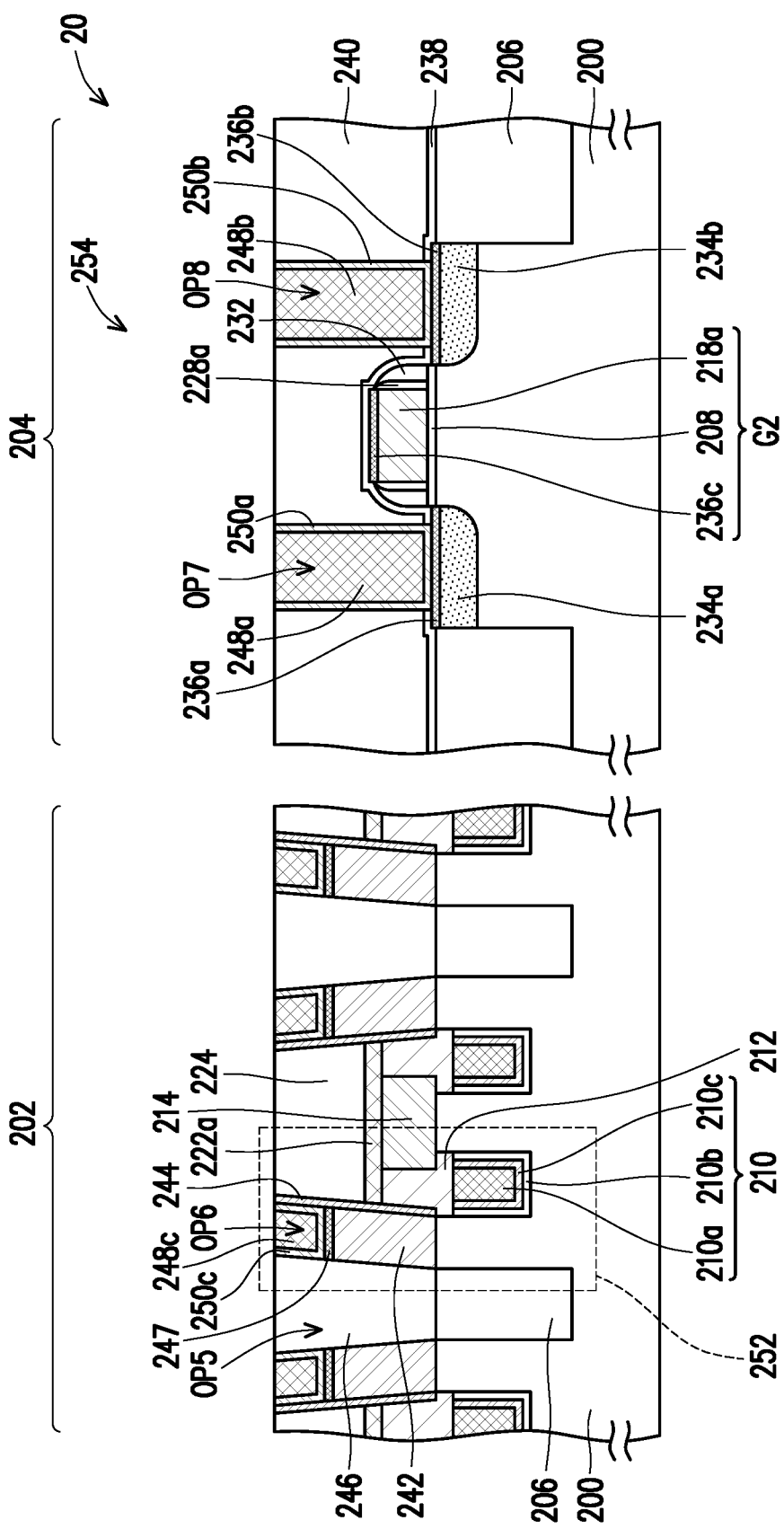

Referring to FIG. 4I, a dielectric layer 240 is formed on the stress adjustment layer 238 in the peripheral circuit region 204. The dielectric layer 240 may cover the nickel silicide layer 236a and the nickel silicide layer 236b. The material of the dielectric layer 240 is, for example, silicon oxide. In the process of forming the dielectric layer 240, the dielectric material layer for forming the dielectric layer 240 may fill in the opening OP4 of the memory cell region 202, and the dielectric material layer filled in the opening OP4 may be removed in the subsequent process to form an opening OP5. In addition, a portion of the stress adjustment layer 238, a portion of the spacer material layer 228, a portion of the hard mask layer 224, a portion of the dielectric layer 216, and a portion of the gate dielectric layer 208 in the memory cell region 202 are removed, whereby the opening OP5 can expose a portion of the substrate 200 and a portion of the isolation structure 206 in the memory cell region 202.

A contact 242 is formed on the substrate 200 on another side of the buried conductive structure 210. The contact 242 is located in the opening OP5. The contact 242 can serve as a storage node contact. The material of the contact 242 is, for example, doped polysilicon. Moreover, a liner layer 244 may be formed on one side of the contact 242, and the liner layer 244 is located between the contact 242 and the conductive line 222a. The material of the liner layer 244 is, for example, silicon nitride. Additionally, a dielectric layer 246 may be formed on another side of the contact 242. The material of the dielectric layer 246 is, for example, silicon nitride. The top of the contact 242 is lower than the top of the liner layer 244 and the top of the dielectric layer 246, so that an opening OP6 is formed between the liner layer 244 and the dielectric layer 246.

A metal silicide layer 247 may be formed on the contact 242, but the invention is not limited thereto. In some embodiments, the metal silicide layer 247 may not be formed. In the present embodiment, the metal silicide layer 247 is formed after the nickel silicide layers 236a to 236c are formed. Furthermore, the material of the metal silicide layer 247 is, for example, cobalt silicide or nickel silicide. The metal silicide layer 247 may be, for example, formed by a salicidation process.

An opening OP7 exposing the nickel silicide layer 236a and an opening OP8 exposing the nickel silicide layer 236b are formed in the dielectric layer 240 of the peripheral circuit region 204. The method of forming the opening OP7 and the opening OP8 is, for example, patterning the dielectric layer 240 and the stress adjustment layer 238 by a lithography process and an etching process.

A contact 248a and a contact 248b are respectively formed in the opening OP7 and the opening OP8. In the present embodiment, the contacts 248a, 248b are formed after the nickel silicide layers 236a to 236c are formed. A contact 248c may be simultaneously formed in opening OP6 of memory cell region 202 in the step of forming the contacts 248a, 248b. The contact 248a, the contact 248b, and the contact 248c are electrically connected to the nickel silicide layer 236a, the nickel silicide layer 236b, and the metal silicide layer 247, respectively. The material of the contacts 248a, 248b, 248c is, for example, tungsten, aluminum, or copper.

In addition, a barrier layer 250a, a barrier layer 250b, and a barrier layer 250c may be formed between the contact 248a and the nickel silicide layer 236a, between the contact 248b and the nickel silicide layer 236b, and between the contact 248c and the metal silicide layer 247, respectively. The material of the barrier layers 250a, 250b, 250c is, for example, Ti, TiN, Ta, TaN, or a combination thereof.

In the present embodiment, the method of forming the contact 248a, the contact 248b, the contact 248c, the barrier layer 250a, the barrier layer 250b, and the barrier layer 250c may include the following steps, but the invention is not limited thereto. A barrier material layer (not shown) is conformally formed in the opening OP6, the opening OP7, and the opening OP8. A contact material layer (not shown) filling the opening OP6, the opening OP7, and the opening OP8 is formed on the barrier material layer. The contact material layer and the barrier material layer outside the opening OP6, opening OP7 and opening OP8 may be removed by a CMP process.

The method of forming the transistor 156 of FIG. 2A to FIG. 2H has at least the following differences from the method of forming the transistor 254 of FIG. 4A to FIG. 4I. In the method of forming the transistor 156 of FIG. 2A to FIG. 2H, after the contact 116 is formed, the nickel silicide layer 144a and the nickel silicide layer 144b are respectively formed on the doped region 132a and the doped region 132b. However, in the method of forming the transistor 254 of FIG. 4A to FIG. 4I, the nickel silicide layers 236a, 236b, 236c are respectively formed on the doped regions 234a, 234b and the doped polysilicon layer 218a after forming the conductive line 222a and before forming the contact 242.

Furthermore, the above method may form a memory cell 252 in the memory cell region 202 and may form a transistor 254 in the peripheral circuit region 204, thereby forming a memory structure 20. Hereinafter, the memory structure 20 of the present embodiment will be described with reference to FIG. 4I.

Referring to FIG. 4I, the memory structure 20 includes the substrate 200, the memory cell 252, and the transistor 254. The substrate 200 includes the memory cell region 202 and the peripheral circuit region 204. The memory cell 252 is located in the memory cell region 202. The memory cell 252 may include the buried conductive structure 210, the contact 214, the conductive line 222a, the contact 242, and the contact 248c. The memory cell 252 may further include at least one of the cap layer 212, the hard mask layer 224, the liner layer 244, the dielectric layer 246, the metal silicide layer 247, and the barrier layer 250c. However, the structure of the memory cell 252 of the invention is not limited thereto. For example, when the memory cell 252 is a DRAM cell, the memory cell 252 may further include a capacitor (not shown) electrically connected to the contact 248c. In addition, the material, the formation method, and the arrangement of each component in the memory cell 252 have been described in detail in the above embodiments, and the description thereof is not repeated herein.

The transistor 254 is located in the peripheral circuit region 204. The transistor 254 includes the gate G2, the doped region 234a, the doped region 234b, the nickel silicide layer 236a, and the nickel silicide layer 236b. The gate G2 is located on the substrate 200 and is insulated from the substrate 200. The gate G2 may include the doped polysilicon layer 218a, the nickel silicide layer 236c, and the gate dielectric layer 208. The nickel silicide layer 236c is located on the doped polysilicon layer 218a. In the present embodiment, the nickel silicide layer 236c may be located on the entire top surface of the doped polysilicon layer 218a. The gate dielectric layer 208 is located between the doped polysilicon layer 218a and the substrate 200, whereby the gate G2 can be insulated from the substrate 200. The doped region 234a and the doped region 234b are located in the substrate 200 on two sides of the gate G2. The nickel silicide layer 236a is located on the entire top surface of the doped region 234a. The nickel silicide layer 236b is located on the entire top surface of the doped region 234b.

The transistor 254 may further include at least one of the spacer 228a, the spacer 232, the stress adjustment layer 238, the dielectric layer 240, the contact 248a, the contact 248b, the barrier layer 250a, and the barrier layer 250b. In addition, the doped polysilicon layer 218a may directly contact the nickel silicide layer 236c and the gate dielectric layer 208. The spacer 232 is located on the sidewall of the doped polysilicon layer 218a. The spacer 228a is located between the spacer 232 and the doped polysilicon layer 218a. The dielectric layer 240 is located on the substrate 200. The contact 248a and the contact 248b are located in the dielectric layer 240 and are electrically connected to the nickel silicide layer 236a and the nickel silicide layer 236b, respectively. The barrier layer 250a is located between contact 248a and nickel silicide layer 236a. The barrier layer 250b is located between contact 248b and nickel silicide layer 236b.

Furthermore, the material, the formation method, and the efficacy of each component in transistor 254 have been described in detail in the above embodiments, and the description thereof is not repeated herein.

Based on the aforementioned embodiment, in the memory structure 20 and the manufacturing method thereof, since the nickel silicide layers 236a, 236b are respectively located on the doped regions 234a, 234b, the transistor 254 in the peripheral circuit region 204 can have lower resistance and larger saturation current. Thereby, the performance of the transistor 254 can be effectively improved. Thus, the electrical performance of the memory structure 20 can be improved.

In summary, in the memory structure and the manufacturing method thereof of the aforementioned embodiments, since the transistor in the peripheral circuit region can reduce the resistance and increase the saturation current by the nickel silicide layer, the performance of the transistor can be effectively improved. Therefore, the electrical performance of the memory structure can be improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory structure, comprising:
    a substrate comprising a memory cell region and a peripheral circuit region;
    a memory cell located in the memory cell region and comprising:
        a buried word line located in the substrate;
        a bit line contact located on the substrate on one side of the buried word line;
        a bit line coupled to the first bit line contact;
        a storage node contact located on the substrate on another side of the buried word line, wherein the buried word line is insulated from the bit line contact and the storage node contact; and
        a metal silicide layer located on the storage node contact; and
    a transistor located in the peripheral circuit region and comprising:
        a gate located on the substrate and insulated from the substrate;
        a first doped region and a second doped region located in the substrate on two sides of the gate;
        a first nickel silicide layer located on an entire top surface of the first doped region; and
        a second nickel silicide layer located on an entire top surface of the second doped region.

2. The memory structure according to claim 1, wherein the gate of the transistor comprises:
    a doped polysilicon layer;
    a metal layer located on the doped polysilicon layer;
    a hard mask layer located on the metal layer; and
    a gate dielectric layer located between the doped polysilicon layer and the substrate.

3. The memory structure according to claim 1, wherein the gate of the transistor comprises:
    a doped polysilicon layer;
    a third nickel silicide layer located on the doped polysilicon layer; and
    a gate dielectric layer located between the doped polysilicon layer and the substrate.

4. The memory structure according to claim 3, wherein the third nickel silicide layer is located on an entire top surface of the doped polysilicon layer, and the doped polysilicon layer directly contacts the third nickel silicide layer and the gate dielectric layer.

5. The memory structure according to claim 1, wherein the first nickel silicide layer and the second nickel silicide layer contain aluminum.

6. The memory structure according to claim 1, wherein the first nickel silicide layer and the second nickel silicide layer comprise salicide layers.

* * * * *